(12) United States Patent
Komasaki et al.

(10) Patent No.: US 8,736,256 B2
(45) Date of Patent: May 27, 2014

(54) ROTATING FIELD SENSOR

(75) Inventors: Yosuke Komasaki, Tokyo (JP); Hiraku Hirabayashi, Tokyo (JP); Shunji Saruki, Tokyo (JP)

(73) Assignee: TDK Corporation, Tokyo (JP)

( * ) Notice: Subject to any disclaimer, the term of this patent is extended or adjusted under 35 U.S.C. 154(b) by 315 days.

(21) Appl. No.: 13/205,209

(22) Filed: Aug. 8, 2011

(65) Prior Publication Data
US 2012/0119729 A1 May 17, 2012

(30) Foreign Application Priority Data

Nov. 17, 2010 (JP) .................................. 2010-256380

(51) Int. Cl.
*G01B 7/30* (2006.01)
(52) U.S. Cl.
USPC ................................ 324/207.21; 324/207.25
(58) Field of Classification Search
USPC .......... 324/207.13–207.21, 244–263, 207.25;
365/157–158, 170–173, 225.5;
73/514.31, 514.39, 520.01, 779,
73/862.193, 862.333
See application file for complete search history.

(56) References Cited

U.S. PATENT DOCUMENTS

| | | | |
|---|---|---|---|
| 5,216,363 A | 6/1993 | Masaaki | |
| 5,363,034 A | 11/1994 | Tada et al. | |
| 6,465,053 B1 | 10/2002 | Lenssen et al. | |
| 6,501,678 B1 | 12/2002 | Lenssen et al. | |
| 6,633,462 B2 | 10/2003 | Adelerhof | |
| 7,259,556 B2 * | 8/2007 | Popovic et al. | 324/244 |
| 2004/0137275 A1 * | 7/2004 | Jander et al. | 428/692 |
| 2006/0214656 A1 * | 9/2006 | Sudo et al. | 324/207.21 |
| 2009/0115405 A1 * | 5/2009 | Guo et al. | 324/207.14 |
| 2009/0206827 A1 * | 8/2009 | Aimuta et al. | 324/207.25 |

FOREIGN PATENT DOCUMENTS

| | | |
|---|---|---|
| JP | B2-2787783 | 8/1998 |
| JP | B2-2990822 | 12/1999 |
| JP | A-2003-502674 | 1/2003 |
| JP | A-2003-502876 | 1/2003 |
| JP | A-2004-504713 | 2/2004 |

* cited by examiner

*Primary Examiner* — Arleen M Vazquez
*Assistant Examiner* — Brent J Andrews
(74) *Attorney, Agent, or Firm* — Oliff PLC

(57) ABSTRACT

A rotating field sensor includes a first detection circuit that outputs a first signal indicating the intensity of a component of a rotating magnetic field in a first direction, a second detection circuit that outputs a second signal indicating the intensity of a component of the rotating magnetic field in a second direction, and an arithmetic circuit that calculates a detected angle value based on the first and second signals. Each of the first and second detection circuits includes at least one MR element row. Each MR element row is composed of a plurality of MR elements connected in series. Each MR element has a magnetization pinned layer. The plurality of MR elements forming each MR element row include one or more pairs of MR elements. Magnetization directions of the magnetization pinned layers in two MR elements making up a pair form a predetermined relative angle other than 0° and 180°.

9 Claims, 24 Drawing Sheets

ROTATING FIELD SENSOR

BACKGROUND OF THE INVENTION

1. Field of the Invention

The present invention relates to a rotating field sensor for detecting an angle that the direction of a rotating magnetic field forms with respect to a reference direction.

2. Description of the Related Art

In recent years, rotating field sensors have been widely used to detect the rotational position of an object in various applications such as detecting the rotational position of an automotive steering wheel. Rotating field sensors are used not only to detect the rotational position of an object but also to detect a linear displacement of an object. Systems using rotating field sensors are typically provided with means (for example, a magnet) for generating a rotating magnetic field whose direction rotates in conjunction with the rotation or linear movement of the object. The rotating field sensors use magnetic detection elements to detect the angle that the direction of the rotating magnetic field forms with respect to a reference direction. The rotational position or linear displacement of the object is thus detected.

There has been known a rotating field sensor that has two bridge circuits (Wheatstone bridge circuits) as shown in U.S. Pat. No. 6,633,462 B2, U.S. Pat. No. 5,363,034, U.S. Pat. No. 5,216,363, U.S. Pat. No. 6,465,053 B1, and U.S. Pat. No. 6,501,678 B1. In such a rotating field sensor, each of the two bridge circuits includes four magnetoresistive elements (hereinafter, also referred to as MR elements) serving as magnetic detection elements. Each of the bridge circuits detects the intensity of a component of the rotating magnetic field in one direction, and outputs a signal that indicates the intensity. The output signals of the two bridge circuits differ in phase by ¼ the period of the output signals of the bridge circuits. The angle that the direction of the rotating magnetic field forms with respect to a reference direction is calculated based on the output signals of the two bridge circuits.

In a rotating field sensor that uses an MR element as a magnetic detection element, the waveform of the output signal of the MR element corresponding to the resistance ideally traces a sinusoidal curve (including a sine waveform and a cosine waveform) as the direction of the rotating magnetic field rotates. However, it is known that the output signal waveform of an MR element can be distorted from a sinusoidal curve, as described in U.S. Pat. No. 6,633,462 B2. Distortion of the output signal waveform of an MR element from a sinusoidal curve means that the output signal of the MR element includes a harmonic component other than a fundamental sinusoidal component, as described in U.S. Pat. Nos. 5,363,034 and 5,216,363. The harmonic component included in the output signal of the MR element may cause an error in the angle detected by the rotating field sensor. The error is mainly caused by a second and a third harmonic component.

U.S. Pat. No. 6,633,462 B2 discloses a magnetoresistive sensor including a main sensing element having a main reference magnetization axis, and two correction sensing elements having their respective reference magnetization axes inclined with respect to the main reference magnetization axis. The two correction sensing elements are electrically connected to the main sensing element to correct the detected angle. The two correction sensing elements output signals that are out of phase with each other by a half period of an error signal of the main sensing element. In this sensor, the output signals of the two correction sensing elements are added to the output signal of the main sensing element. This allows for eliminating at least part of the error signal of the main sensing element. The sensor disclosed in U.S. Pat. No. 6,633,462 B2, however, has a drawback of increasing in size because the two correction sensing elements are required in addition to the main sensing element. Further, the sensor requires that the resistances of the correction sensing elements be set to an optimum value different from that of the main sensing element. This poses a problem that it is not easy to design and manufacture this sensor.

U.S. Pat. Nos. 5,363,034 and 5,216,363 disclose a technique for reducing harmonic components of the output signal of a magnetic sensor that is disposed to face a magnetic scale in which magnets are arrayed with a predetermined pitch. According to the technique, the harmonic components are reduced by serially connecting a plurality of magnetoresistive elements that are spaced apart from each other by a predetermined distance in the direction in which the magnets are arrayed. However, this technique requires that the arrangement of the plurality of magnetoresistive elements be changed according to the array pitch of the magnets because the arrangement of the magnetoresistive elements depends on the array pitch of the magnets. For this reason, this technique has the problem that it cannot be applied to the case where the magnets are arrayed with an arbitrary pitch.

OBJECT AND SUMMARY OF THE INVENTION

It is an object of the present invention to provide a rotating field sensor for detecting an angle that the direction of a rotating magnetic field forms with respect to a reference direction, the rotating field sensor being capable of reducing errors in the detected angle with a simple configuration.

A rotating field sensor of the present invention detects an angle that the direction of a rotating magnetic field in a reference position forms with respect to a reference direction. The rotating field sensor includes a first detection circuit, a second detection circuit, and an arithmetic circuit. The first detection circuit detects the intensity of a component of the rotating magnetic field in a first direction and outputs a first signal indicating the intensity. The second detection circuit detects the intensity of a component of the rotating magnetic field in a second direction and outputs a second signal indicating the intensity. The arithmetic circuit calculates, based on the first and second signals, a detected angle value having a correspondence relationship with the angle that the direction of the rotating magnetic field in the reference position forms with respect to the reference direction.

Each of the first and second detection circuits includes at least one row of magnetoresistive elements. Each row of magnetoresistive elements is composed of a plurality of magnetoresistive elements connected in series. Each of the plurality of magnetoresistive elements has a magnetization pinned layer whose magnetization direction is pinned, a free layer whose magnetization direction varies according to the direction of the rotating magnetic field, and a nonmagnetic layer disposed between the magnetization pinned layer and the free layer. The number of the plurality of magnetoresistive elements forming each row of magnetoresistive elements is an even number not smaller than two.

The plurality of magnetoresistive elements forming each row of magnetoresistive elements include one or more pairs of magnetoresistive elements. The magnetization directions of the magnetization pinned layers in two magnetoresistive elements making up a pair form a predetermined relative angle other than 0° and 180°.

The at least one row of magnetoresistive elements in the first detection circuit does not include any magnetoresistive element that has a magnetization pinned layer whose magnetization direction is pinned in the first direction or in a direction opposite to the first direction. The at least one row of magnetoresistive elements in the second detection circuit does not include any magnetoresistive element that has a magnetization pinned layer whose magnetization direction is pinned in the second direction or in a direction opposite to the second direction.

In the rotating field sensor of the present invention, the potential difference across each magnetoresistive element corresponding to the resistance of the magnetoresistive element varies periodically as the direction of the rotating magnetic field rotates. The periodically varying component of the potential difference across each magnetoresistive element may include a harmonic component in addition to an ideal sinusoidal component. As used herein, the term "harmonic component" with no order specified shall include not only a harmonic component of a single order but also a combination of harmonic components of multiple orders. The harmonic component may cause some error in the angle detected by the rotating field sensor. In the rotating field sensor of the present invention, the magnetization directions of the magnetization pinned layers in two magnetoresistive elements making up a pair form a predetermined relative angle other than 0° and 180°. For this reason, the harmonic component produced in the potential difference across one magnetoresistive element of a pair of magnetoresistive elements and the harmonic component produced in the potential difference across the other magnetoresistive element of the pair are out of phase with each other. Furthermore, in the present invention, two magnetoresistive elements making up a pair are connected in series. This allows the harmonic component produced in the potential difference across one magnetoresistive element of a pair of magnetoresistive elements and the harmonic component produced in the potential difference across the other magnetoresistive element of the pair to be combined with each other, thereby allowing a reduction in the harmonic component in the potential difference across the pair of magnetoresistive elements. As a result, it is possible to reduce the error in the angle detected by the rotating field sensor.

In the rotating field sensor of the present invention, the second direction may be orthogonal to the first direction. Each of the first and second detection circuits may include, as the at least one row of magnetoresistive elements, two rows of magnetoresistive elements connected in series. Alternatively, each of the first and second detection circuits may include, as the at least one row of magnetoresistive elements, first and second rows of magnetoresistive elements connected in series and third and fourth rows of magnetoresistive elements connected in series. The first to fourth rows of magnetoresistive elements may form a Wheatstone bridge circuit.

Where the first to fourth rows of magnetoresistive elements form a Wheatstone bridge circuit, the magnetization pinned layer in each of the plurality of magnetoresistive elements that form the third row of magnetoresistive elements may have the magnetization direction the same as that of the magnetization pinned layer in a corresponding one of the plurality of magnetoresistive elements that form the second row of magnetoresistive elements, and the magnetization pinned layer in each of the plurality of magnetoresistive elements that form the fourth row of magnetoresistive elements may have the magnetization direction the same as that of the magnetization pinned layer in a corresponding one of the plurality of magnetoresistive elements that form the first row of magnetoresistive elements. In this case, respective corresponding ones of the magnetoresistive elements in the first row and the fourth row whose magnetization pinned layers have the same magnetization direction may be disposed adjacent to each other, while respective corresponding ones of the magnetoresistive elements in the second row and the third row whose magnetization pinned layers have the same magnetization direction may be disposed adjacent to each other.

In the rotating field sensor of the present invention, the plurality of magnetoresistive elements that form the at least one row of magnetoresistive elements in the first detection circuit may include only one pair of magnetoresistive elements. In this case, the first direction may be an intermediate direction between the magnetization directions of the magnetization pinned layers of two magnetoresistive elements making up the pair, or may be a direction opposite to the intermediate direction. The plurality of magnetoresistive elements that form the at least one row of magnetoresistive elements in the second detection circuit may include only one pair of magnetoresistive elements. In this case, the second direction may be an intermediate direction between the magnetization directions of the magnetization pinned layers of two magnetoresistive elements making up the pair, or may be a direction opposite to the intermediate direction.

In the rotating field sensor of the present invention, the plurality of magnetoresistive elements that form the at least one row of magnetoresistive elements in the first detection circuit may include a first and a second pair of magnetoresistive elements. In this case, the first direction may be an intermediate direction between a third direction and a fourth direction or may be a direction opposite to the intermediate direction, where the third direction is a direction intermediate between the magnetization directions of the magnetization pinned layers of two magnetoresistive elements making up the first pair, and the fourth direction is a direction intermediate between the magnetization directions of the magnetization pinned layers of two magnetoresistive elements making up the second pair. The plurality of magnetoresistive elements that form the at least one row of magnetoresistive elements in the second detection circuit may include a third and a fourth pair of magnetoresistive elements. In this case, the second direction may be an intermediate direction between a fifth direction and a sixth direction or may be a direction opposite to the intermediate direction, where the fifth direction is a direction intermediate between the magnetization directions of the magnetization pinned layers of two magnetoresistive elements making up the third pair, and the sixth direction is a direction intermediate between the magnetization directions of the magnetization pinned layers of two magnetoresistive elements making up the fourth pair.

As described above, the rotating field sensor of the present invention makes it possible to reduce the harmonic component in the potential difference across a pair of magnetoresistive elements. This allows reducing the error in the angle detected by the rotating field sensor. Furthermore, in the rotating field sensor of the present invention, the at least one row of magnetoresistive elements in the first detection circuit does not include any magnetoresistive element that has a magnetization pinned layer whose magnetization direction is pinned in the first direction or in the direction opposite to the first direction, and the at least one row of magnetoresistive elements in the second detection circuit does not include any magnetoresistive element that has a magnetization pinned layer whose magnetization direction is pinned in the second direction or in the direction opposite to the second direction. This makes it possible to reduce the number of magnetoresistive elements to be included in each detection circuit and makes it easier to design each detection circuit, as compared with a case where the first detection circuit includes a magnetoresistive element that has a magnetization pinned layer whose magnetization direction is pinned in the first direction or in the direction opposite to the first direction while the second detection circuit includes a magnetoresistive element that has a magnetization pinned layer whose magnetization direction is pinned in the second direction or in the direction opposite to the second direction. Consequently, according to the present invention, it is possible to reduce the error in the detected angle with a simple configuration.

Other and further objects, features and advantages of the present invention will appear more fully from the following description.

DETAILED DESCRIPTION OF THE PREFERRED EMBODIMENTS

First Embodiment

Figure 1:
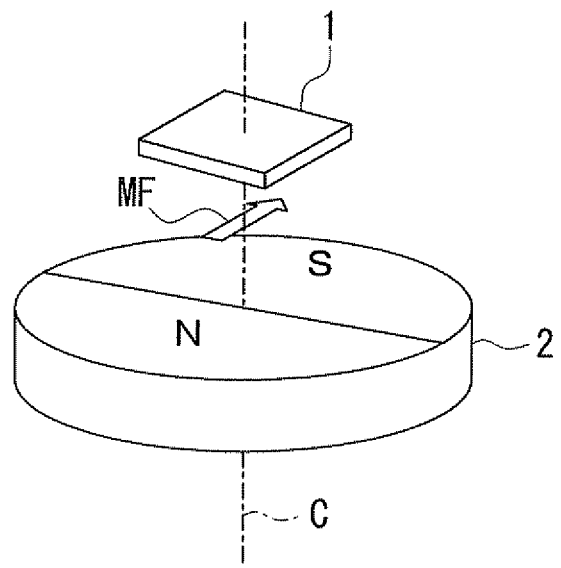
FIG. 1 is a perspective view showing the general configuration of a rotating field sensor according to a first embodiment of the invention.
Figure 2:
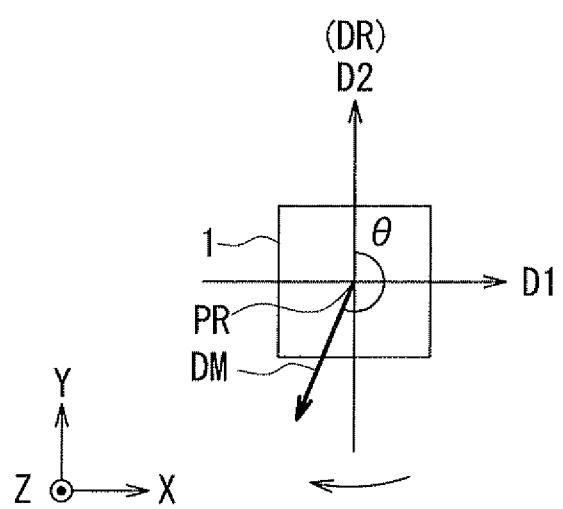
FIG. 2 is an explanatory diagram illustrating the definitions of directions and angles in the first embodiment of the invention.

Preferred embodiments of the present invention will now be described in detail with reference to the drawings. First, reference is made to FIG. 1 and FIG. 2 to describe the general configuration of a rotating field sensor according to a first embodiment of the invention. FIG. 1 is a perspective view showing the general configuration of the rotating field sensor according to the present embodiment. FIG. 2 is an explanatory diagram illustrating the definitions of directions and angles in the present embodiment.

As shown in FIG. 1, the rotating field sensor 1 according to the present embodiment detects the angle that the direction of a rotating magnetic field MF in a reference position forms with respect to a reference direction. In FIG. 1, a cylindrical magnet 2 is shown as an example of means for generating the rotating magnetic field MF whose direction rotates. The magnet 2 has an N pole and an S pole that are arranged symmetrically with respect to a virtual plane including the central axis of the cylinder. The magnet 2 rotates about the central axis of the cylinder. Consequently, the direction of the rotating magnetic field MF generated by the magnet 2 rotates about a center of rotation C including the central axis of the cylinder. The rotating field sensor 1 is disposed to face one end face of the magnet 2. The means for generating the rotating magnetic field MF whose direction rotates is not limited to the magnet 2 shown in FIG. 1, as will be described later in relation to a modification example of the present embodiment.

With reference to FIG. 2, the definitions of directions and angles in the present embodiment will be described. First, a direction that is parallel to the center of rotation C shown in FIG. 1 and is from the one end face of the magnet 2 to the rotating field sensor 1 will be defined as the Z direction. Next, two mutually-orthogonal directions on a virtual plane perpendicular to the Z direction will be defined as the X direction and Y direction. In FIG. 2, the X direction is shown as the direction toward the right, and the Y direction is shown as the upward direction. The direction opposite to the X direction will be defined as the −X direction, and the direction opposite to the Y direction will be defined as the −Y direction.

The reference position PR is the position where the rotating field sensor 1 detects the rotating magnetic field MF. For example, the reference position PR shall be where the rotating field sensor 1 is located. The reference direction DR shall be the Y direction. The angle that the direction DM of the rotating magnetic field MF in the reference position PR forms with respect to the reference direction DR will be designated by symbol θ. The direction DM of the rotating magnetic field MF shall rotate clockwise in FIG. 2. The angle θ will be expressed in a positive value when seen clockwise from the reference direction DR, and in a negative value when seen counterclockwise from the reference direction DR.

The rotating field sensor 1 detects, in the reference position PR, a component of the rotating magnetic field MF in a first direction D1 and a component of the rotating magnetic field MF in a second direction D2. In the present embodiment, the second direction D2 is orthogonal to the first direction D1, and coincides with the reference direction DR (the Y direction). The first direction D1 is the direction rotated from the second direction D2 (the reference direction DR) by 90°.

Figure 3:
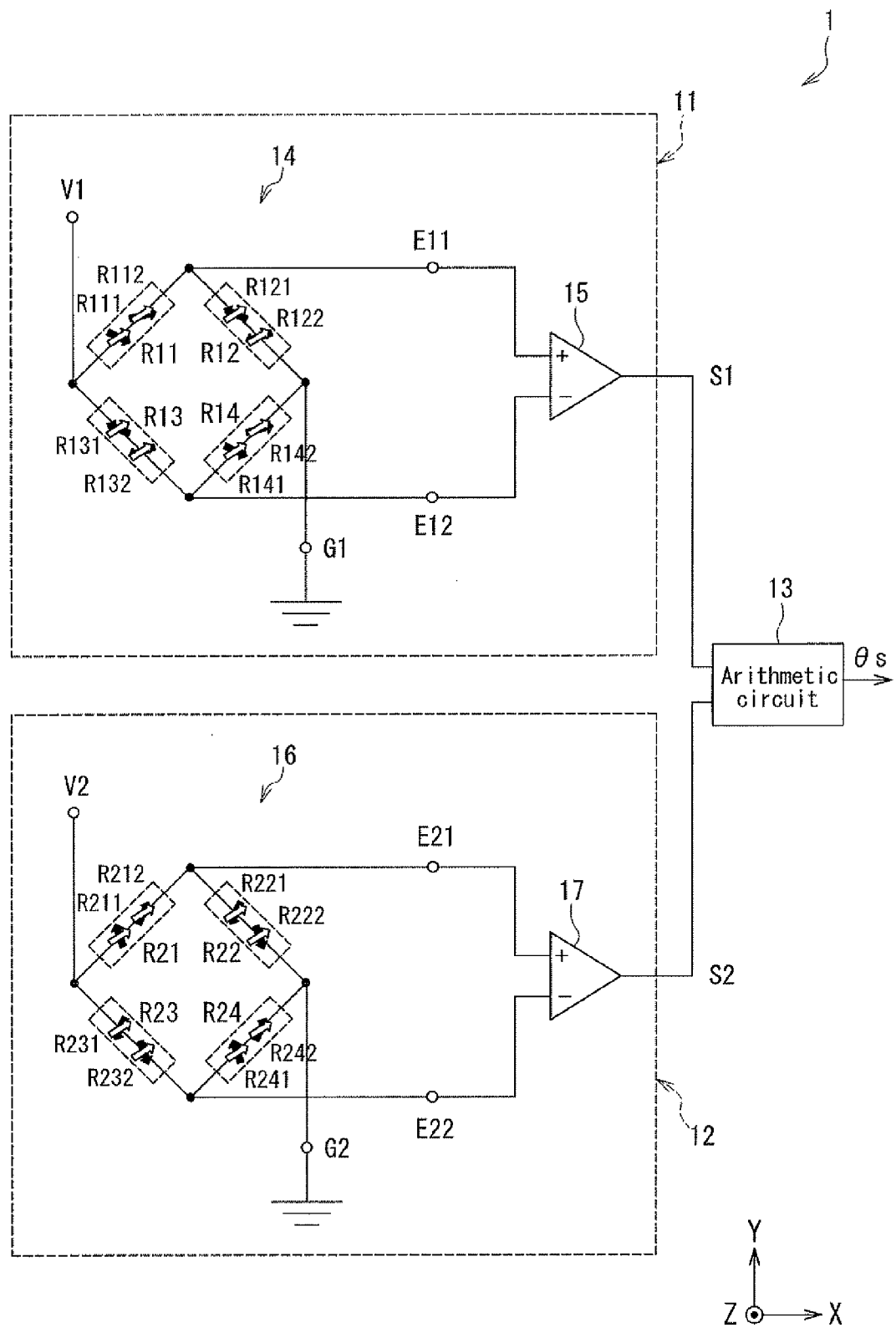
FIG. 3 is a circuit diagram showing the configuration of the rotating field sensor according to the first embodiment of the invention.

Next, the configuration of the rotating field sensor 1 will be described in detail with reference to FIG. 3. FIG. 3 is a circuit diagram showing the configuration of the rotating field sensor 1. The rotating field sensor 1 includes a first detection circuit 11, a second detection circuit 12, and an arithmetic circuit 13. The first detection circuit 11 detects the intensity of the component of the rotating magnetic field MF in the first direction D1 and outputs a first signal S1 indicating the intensity. The second detection circuit 12 detects the intensity of the component of the rotating magnetic field MF in the second direction D2 and outputs a second signal S2 indicating the intensity. The arithmetic circuit 13 calculates, based on the first signal S1 and the second signal S2, a detected angle value θs having a correspondence relationship with the angle θ that the direction DM of the rotating magnetic field MF in the reference position PR forms with respect to the reference direction DR. The arithmetic circuit 13 can be implemented by a single microcomputer, for example. The method of calculating the detected angle value θs will be described in detail later.

The first signal S1 and the second signal S2 vary periodically with the same signal period T. In the present embodiment, the second signal S2 preferably differs from the first signal S1 in phase by an odd number of times ¼ the signal period T. However, in consideration of the production accuracy of the magnetic detection elements and other factors, the difference in phase between the first signal S1 and the second signal S2 can be slightly different from an odd number of times ¼ the signal period T. The following description assumes that the phases of the first signal S1 and the second signal S2 satisfy the aforementioned preferable relationship.

Each of the first and second detection circuits 11 and 12 includes at least one row of magnetoresistive (MR) elements (hereinafter referred to as MR element row). Each MR element row is composed of a plurality of MR elements connected in series. As will be described in detail later, each MR element has a magnetization pinned layer whose magnetization direction is pinned, a free layer whose magnetization direction varies according to the direction of the rotating magnetic field, and a nonmagnetic layer disposed between the magnetization pinned layer and the free layer. The number of the plurality of MR elements forming each MR element row is an even number not smaller than two. The plurality of MR elements forming each MR element row include one or more pairs of MR elements. The magnetization directions of the magnetization pinned layers in two MR elements making up a pair form a predetermined relative angle other than 0° and 180°.

Each of the first and second detection circuits 11 and 12 may include, as the at least one MR element row, two MR element rows connected in series. Alternatively, each of the first and second detection circuits 11 and 12 may include, as the at least one MR element row, first and second MR element rows connected in series and third and fourth MR element rows connected in series. The first to fourth MR element rows may form a Wheatstone bridge circuit. The following description will deal with the case where the first to fourth MR element rows form a Wheatstone bridge circuit.

The first detection circuit 11 has a Wheatstone bridge circuit 14 and a difference detector 15. The Wheatstone bridge circuit 14 includes a power supply port V1, a ground port G1, two output ports E11 and E12, first and second MR element rows R11 and R12 connected in series, and third and fourth MR element rows R13 and R14 connected in series. Each of the first to fourth MR element rows R11 to R14 is composed of a plurality of MR elements connected in series. Each of the first to fourth MR element rows R11 to R14 has a first end and a second end.

The first end of the first MR element row R11 and the first end of the third MR element row R13 are connected to the power supply port V1. The second end of the first MR element row R11 is connected to the first end of the second MR element row R12 and the output port E11. The second end of the third MR element row R13 is connected to the first end of the fourth MR element row R14 and the output port E12. The second end of the second MR element row R12 and the second end of the fourth MR element row R14 are connected to the ground port G1. A power supply voltage of predetermined magnitude is applied to the power supply port V1. The ground port G1 is grounded. The difference detector 15 outputs to the arithmetic circuit 13 a signal corresponding to the potential difference between the output ports E11 and E12 as the first signal S1.

The second detection circuit 12 has a Wheatstone bridge circuit 16 and a difference detector 17. The Wheatstone bridge circuit 16 includes a power supply port V2, a ground port G2, two output ports E21 and E22, first and second MR element rows R21 and R22 connected in series, and third and fourth MR element rows R23 and R24 connected in series. Each of the first to fourth MR element rows R21 to R24 is composed of a plurality of MR elements connected in series. Each of the first to fourth MR element rows R21 to R24 has a first end and a second end.

The first end of the first MR element row R21 and the first end of the third MR element row R23 are connected to the power supply port V2. The second end of the first MR element row R21 is connected to the first end of the second MR element row R22 and the output port E21. The second end of the third MR element row R23 is connected to the first end of the fourth MR element row R24 and the output port E22. The second end of the second MR element row R22 and the second end of the fourth MR element row R24 are connected to the ground port G2. A power supply voltage of predetermined magnitude is applied to the power supply port V2. The ground port G2 is grounded. The difference detector 17 outputs to the arithmetic circuit 13 a signal corresponding to the potential difference between the output ports E21 and E22 as the second signal S2.

In the present embodiment, all the MR elements included in the Wheatstone bridge circuits (hereinafter, referred to as bridge circuits) 14 and 16 are TMR elements. However, GMR elements may be employed instead of the TMR elements. The TMR elements or GMR elements each have a magnetization pinned layer whose magnetization direction is pinned, a free layer whose magnetization direction varies according to the direction of the rotating magnetic field MF, and a nonmagnetic layer disposed between the magnetization pinned layer and the free layer. For TMR elements, the nonmagnetic layer is a tunnel barrier layer. For GMR elements, the nonmagnetic layer is a nonmagnetic conductive layer. The TMR elements or GMR elements vary in resistance depending on the angle that the magnetization direction of the free layer forms with respect to the magnetization direction of the magnetization pinned layer. The resistance reaches its minimum value when the foregoing angle is 0°. The resistance reaches its maximum value when the foregoing angle is 180°. In FIG. 3, the filled arrows indicate the magnetization directions of the magnetization pinned layers in the MR elements. The hollow arrows indicate the magnetization directions of the free layers in the MR elements.

In the first detection circuit 11, the magnetization directions of the magnetization pinned layers in the plurality of MR elements are pinned so that the potential difference between the output ports E11 and E12 varies according to the intensity of the component of the rotating magnetic field MF in the first direction D1. The first direction D1 therefore serves as a reference direction when the first detection circuit 11 detects the rotating magnetic field MF. The first detection circuit 11 detects the intensity of the component of the rotating magnetic field MF in the first direction D1, and outputs the first signal. S1 indicating the intensity. In the example shown in FIG. 3, the magnetization directions of the magnetization pinned layers in the plurality of MR elements are pinned so that the potential difference between the output ports E11 and E12 varies according to the intensity of the component of the rotating magnetic field MF in the X direction. In this example, the first direction D1 is the same as the X direction.

In the second detection circuit 12, the magnetization directions of the magnetization pinned layers in the plurality of MR elements are pinned so that the potential difference between the output ports E21 and E22 varies according to the intensity of the component of the rotating magnetic field MF in the second direction D2. The second direction D2 therefore serves as a reference direction when the second detection circuit 12 detects the rotating magnetic field MF. The second detection circuit 12 detects the intensity of the component of the rotating magnetic field MF in the second direction D2, and outputs the second signal S2 indicating the intensity. In the example shown in FIG. 3, the magnetization directions of the magnetization pinned layers in the plurality of MR elements are pinned so that the potential difference between the output ports E21 and E22 varies according to the intensity of the component of the rotating magnetic field MF in the Y direction. In this example, the second direction D2 is the same as the Y direction.

Now, a detailed description will be given of a plurality of MR elements that form each MR element row. First, a plurality of MR elements forming the first to fourth MR element rows R11, R12, R13, and R14 of the bridge circuit 14 will be described. Each of the first to fourth MR element rows R11, R12, R13, and R14 is composed of two MR elements connected in series. The first MR element row R11 is composed of a pair of MR elements R111 and R112. The second MR element row R12 is composed of a pair of MR elements R121 and R122. The third MR element row R13 is composed of a pair of MR elements R131 and R132. The fourth MR element row R14 is composed of a pair of MR elements R141 and R142.

One end of the MR element R111 serves as the first end of the first MR element row R11. The other end of the MR element R111 is connected to one end of the MR element R112. The other end of the MR element R112 serves as the second end of the first MR element row R11.

One end of the MR element R121 serves as the first end of the second MR element row R12. The other end of the MR element R121 is connected to one end of the MR element R122. The other end of the MR element R122 serves as the second end of the second MR element row R12.

One end of the MR element R131 serves as the first end of the third MR element row R13. The other end of the MR element R131 is connected to one end of the MR element R132. The other end of the MR element R132 serves as the second end of the third MR element row R13.

One end of the MR element R141 serves as the first end of the fourth MR element row R14. The other end of the MR element R141 is connected to one end of the MR element R142. The other end of the MR element R142 serves as the second end of the fourth MR element row R14.

Note that the MR elements R111 and R112 forming the first MR element row R11 have only to be connected in series between the first and second ends of the first MR element row R11, and may be arranged in the order opposite to that in the example shown in FIG. 3. Likewise, two MR elements forming each of the other MR element rows have only to be connected in series between the first and second ends of the MR element row, and may be arranged in the order opposite to that in the example shown in FIG. 3.

Figure 4:
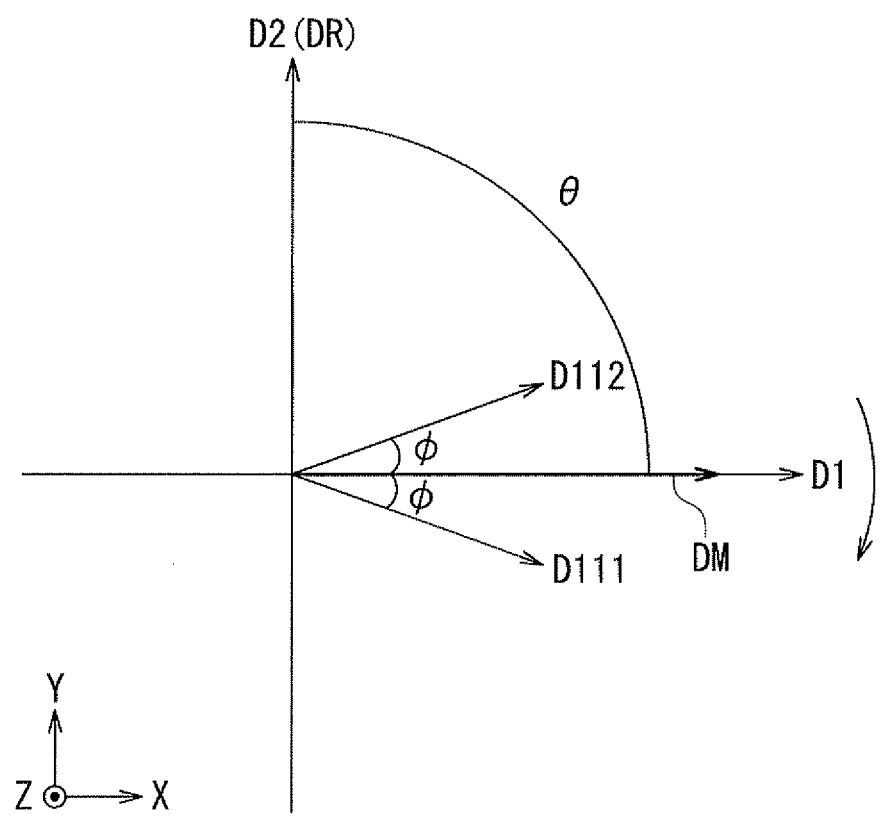
FIG. 4 is an explanatory diagram illustrating the magnetization directions of magnetization pinned layers in a pair of MR elements that form an MR element row in the rotating field sensor shown in FIG. 3.

Now, a description will be given of the magnetization directions of the magnetization pinned layers in the MR elements R111, R112, R121, R122, R131, R132, R141, and R142. FIG. 4 is an explanatory diagram showing the magnetization directions of the magnetization pinned layers in the pair of MR elements R111 and R112 forming the first MR element row R11. In FIG. 4, the arrows with symbols D111 and D112 indicate the magnetization directions of the magnetization pinned layers in the MR elements R111 and R112, respectively. The magnetization directions D111 and D112 of the magnetization pinned layers in the MR elements R111 and R112 are pinned so that the intermediate direction between the directions D111 and D112 is the same as the first direction D1 (the X direction). The magnetization directions D111 and D112 of the magnetization pinned layers in the MR elements R111 and R112 form a predetermined relative angle $2\phi$ other than 0° and 180°. The magnetization direction D111 of the magnetization pinned layer in the MR element R111 is the direction rotated clockwise from the first direction D1 by an angle $\phi$. The magnetization direction D112 of the magnetization pinned layer in the MR element R112 is the direction rotated counterclockwise from the first direction D1 by the angle $\phi$.

The magnetization directions of the magnetization pinned layers in the pair of MR elements R121 and R122 forming the second MR element row R12 are pinned so that the intermediate direction between those magnetization directions is opposite to the first direction D1, i.e., the −X direction. The magnetization directions of the magnetization pinned layers in the pair of MR elements R131 and R132 forming the third MR element row R13 are also pinned so that the intermediate direction between those magnetization directions is opposite to the first direction D1. The magnetization direction of the magnetization pinned layer in the MR element R131 is the same as that of the magnetization pinned layer in the MR element R121. The magnetization direction of the magnetization pinned layer in the MR element R132 is the same as that of the magnetization pinned layer in the MR element R122. The magnetization direction of the magnetization pinned layers in the MR elements R121 and R131 is opposite to the magnetization direction D111 of the magnetization pinned layer in the MR element R111 shown in FIG. 4. The magnetization direction of the magnetization pinned layers in the MR elements R122 and R132 is opposite to the magnetization direction D112 of the magnetization pinned layer in the MR element R112 shown in FIG. 4.

The magnetization directions of the magnetization pinned layers in the MR elements R121 and R122 form a relative angle $2\phi$. The magnetization directions of the magnetization pinned layers in the MR elements R131 and R132 also form the relative angle $2\phi$. The magnetization direction of the magnetization pinned layers in the MR elements R121 and R131 is the direction rotated clockwise by the angle $\phi$ from the direction opposite to the first direction D1. The magnetization direction of the magnetization pinned layers in the MR elements R122 and R132 is the direction rotated counterclockwise by the angle $\phi$ from the direction opposite to the first direction D1.

The magnetization directions of the magnetization pinned layers in the pair of MR elements R141 and R142 forming the fourth MR element row R14 are pinned so that the intermediate direction between those magnetization directions is the same as the first direction D1 (the X direction). The magnetization direction of the magnetization pinned layer in the MR element R141 is the same as the magnetization direction D111 of the magnetization pinned layer in the MR element R111 shown in FIG. 4. The magnetization direction of the magnetization pinned layer in the MR element R142 is the same as the magnetization direction D112 of the magnetization pinned layer in the MR element R112 shown in FIG. 4.

The magnetization directions of the magnetization pinned layers in the MR elements R141 and R142 form a relative angle $2\phi$. The magnetization direction of the magnetization pinned layer in the MR element R141 is the direction rotated clockwise from the first direction D1 by the angle $\phi$. The magnetization direction of the magnetization pinned layer in the MR element R142 is the direction rotated counterclockwise from the first direction D1 by the angle $\phi$.

Next, a description will be given of a plurality of MR elements that form the first to fourth MR element rows R21, R22, R23, and R24 of the bridge circuit 16. Each of the first to fourth MR element rows R21, R22, R23, and R24 is composed of two MR elements connected in series. The first MR element row R21 is composed of a pair of MR elements R211 and R212. The second MR element row R22 is composed of a pair of MR elements R221 and R222. The third MR element row R23 is composed of a pair of MR elements R231 and R232. The fourth MR element row R24 is composed of a pair of MR elements R241 and R242.

One end of the MR element R211 serves as the first end of the first MR element row R21. The other end of the MR element R211 is connected to one end of the MR element R212. The other end of the MR element R212 serves as the second end of the first MR element row R21.

One end of the MR element R221 serves as the first end of the second MR element row R22. The other end of the MR element R221 is connected to one end of the MR element R222. The other end of the MR element R222 serves as the second end of the second MR element row R22.

One end of the MR element R231 serves as the first end of the third MR element row R23. The other end of the MR element R231 is connected to one end of the MR element R232. The other end of the MR element R232 serves as the second end of the third MR element row R23.

One end of the MR element R241 serves as the first end of the fourth MR element row R24. The other end of the MR element R241 is connected to one end of the MR element R242. The other end of the MR element R242 serves as the second end of the fourth MR element row R24.

Note that the MR elements R211 and R212 forming the first MR element row R21 have only to be connected in series between the first and second ends of the first MR element row R21, and may be arranged in the order opposite to that of the example shown in FIG. 3. Likewise, two MR elements forming each of the other MR element rows have only to be connected in series between the first and second ends of the MR element row, and may be arranged in the order opposite to that of the example shown in FIG. 3.

Now, a description will be given of the magnetization directions of the magnetization pinned layers in the MR elements R211, R212, R221, R222, R231, R232, R241, and R242. The magnetization directions of the magnetization pinned layers in the pair of MR elements R211 and R212 forming the first MR element row R21 are pinned so that the intermediate direction between those magnetization directions is the same as the second direction D2 (the Y direction). The magnetization directions of the magnetization pinned layers in the pair of MR elements R241 and R242 forming the fourth MR element row R24 are also pinned so that the intermediate direction between those magnetization directions is the same as the second direction D2. The magnetization direction of the magnetization pinned layer in the MR element R241 is the same as that of the magnetization pinned layer in the MR element R211. The magnetization direction of the magnetization pinned layer in the MR element R242 is the same as that of the magnetization pinned layer in the MR element R212. The magnetization direction of the magnetization pinned layers in the MR elements R211 and R241 is the direction rotated counterclockwise by 90° from the magnetization direction D112 of the magnetization pinned layer in the MR element R112 shown in FIG. 4. The magnetization direction of the magnetization pinned layers in the MR elements R212 and R242 is the direction rotated counterclockwise by 90° from the magnetization direction D111 of the magnetization pinned layer in the MR element R111 shown in FIG. 4.

The magnetization directions of the magnetization pinned layers in the MR elements R211 and R212 form a relative angle 2φ. The magnetization directions of the magnetization pinned layers in the MR elements R241 and R242 also form the relative angle 2φ. The magnetization direction of the magnetization pinned layers in the MR elements R211 and R241 is the direction rotated counterclockwise from the second direction D2 by the angle φ. The magnetization direction of the magnetization pinned layers in the MR elements R212 and R242 is the direction rotated clockwise from the second direction D2 by the angle φ.

The magnetization directions of the magnetization pinned layers in the pair of MR elements R221 and R222 forming the second MR element row R22 are pinned so that the intermediate direction between those magnetization directions is opposite to the second direction D2, i.e., the −Y direction. The magnetization directions of the magnetization pinned layers in the pair of MR elements R231 and R232 forming the third MR element row R23 are also pinned so that the intermediate direction between those magnetization directions is opposite to the second direction D2. The magnetization direction of the magnetization pinned layer in the MR element R231 is the same as that of the magnetization pinned layer in the MR element R221. The magnetization direction of the magnetization pinned layer in the MR element R232 is the same as that of the magnetization pinned layer in the MR element R222. The magnetization direction of the magnetization pinned layers in the MR elements R221 and R231 is opposite to the magnetization direction of the magnetization pinned layers in the MR elements R212 and R242. The magnetization direction of the magnetization pinned layers in the MR elements R222 and R232 is opposite to the magnetization direction of the magnetization pinned layers in the MR elements R211 and R241.

The magnetization directions of the magnetization pinned layers in the MR elements R221 and R222 form a relative angle 2φ. The magnetization directions of the magnetization pinned layers in the MR elements R231 and R232 also form the relative angle 2φ. The magnetization direction of the magnetization pinned layers in the MR elements R221 and R231 is the direction rotated clockwise by the angle φ from the direction opposite to the second direction D2. The magnetization direction of the magnetization pinned layers in the MR elements R222 and R232 is the direction rotated counterclockwise by the angle φ from the direction opposite to the second direction D2.

As described above, each MR element row in the first and second detection circuits 11 and 12 is composed of a pair of MR elements each having a magnetization pinned layer whose magnetization direction is pinned in a predetermined direction. None of the first to fourth MR element rows R11, R12, R13, and R14 in the first detection circuit 11 includes any MR element that has a magnetization pinned layer whose magnetization direction is pinned in the first direction D1 (the X direction) or in the direction opposite to the first direction D1 (the −X direction). None of the first to fourth MR element rows R21, R22, R23, and R24 in the second detection circuit 12 includes any MR element that has a magnetization pinned layer whose magnetization direction is pinned in the second direction D2 (the Y direction) or in the direction opposite to the second direction D2 (the −Y direction).

In consideration of the production accuracy of the MR elements and other factors, the magnetization directions of the magnetization pinned layers in the plurality of MR elements in the detection circuits 11 and 12 can be slightly different from the above-described directions.

Figure 5A:
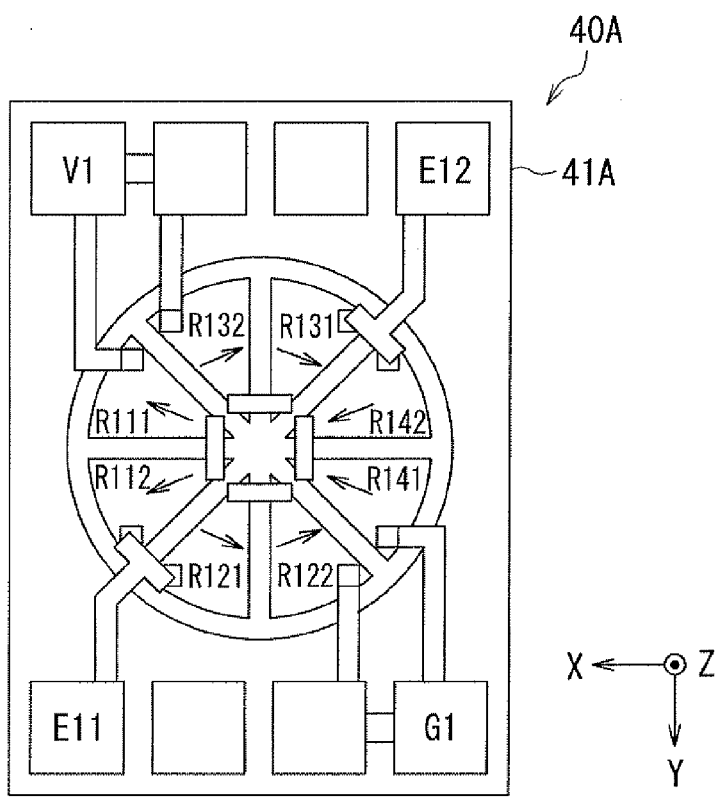
FIG. 5A and FIG. 5B are plan views of two units that respectively incorporate the two bridge circuits of the rotating field sensor shown in FIG. 3.
Figure 5B:
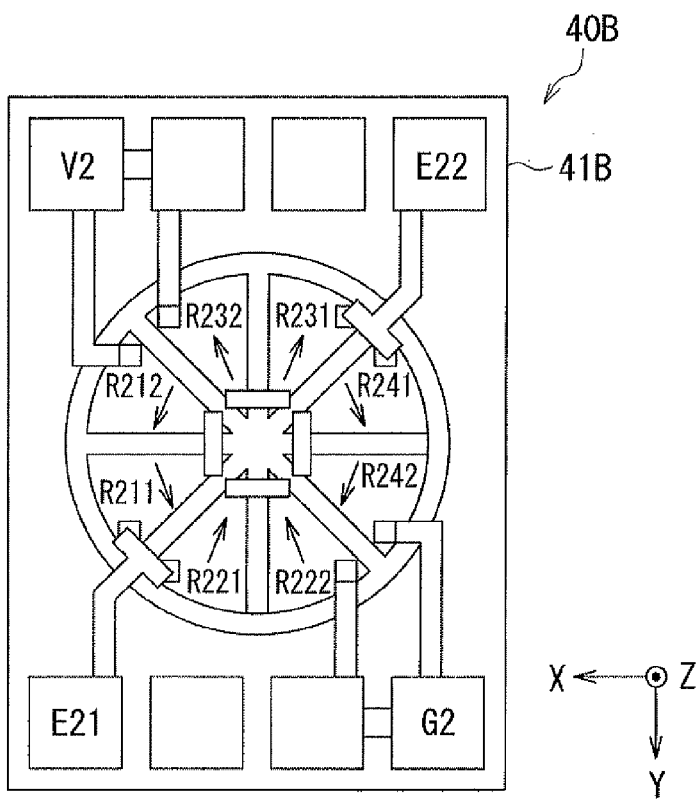

Reference is now made to FIG. 5A and FIG. 5B to describe an example of two units that incorporate the bridge circuits 14 and 16 of the rotating field sensor 1, respectively. FIG. 5A and FIG. 5B are plan views showing an example of the units that incorporate the bridge circuits 14 and 16, respectively. FIG. 5A shows a unit 40A incorporating the bridge circuit 14. FIG. 5B shows a unit 40B incorporating the bridge circuit 16. The unit 40A includes a substrate 41A, and the bridge circuit 14 provided on the substrate 41A. The plurality of ports of the bridge circuit 14 are arranged on the substrate 41A, near peripheral edges of the substrate 41A. An MR element layout area of circular shape is provided on the substrate 41A. The MR element layout area is circumferentially divided into eight sections. The MR elements R111, R112, R121, R122, R131, R132, R141, and R142 are located in the eight sections, respectively. Wiring for electrically connecting the plurality of MR elements to the plurality of ports is formed on the substrate 41A.

The unit 40B includes a substrate 41B, and the bridge circuit 16 provided on the substrate 41B. The plurality of ports of the bridge circuit 16 are arranged on the substrate 41B, near peripheral edges of the substrate 41B. An MR element layout area of circular shape is provided on the substrate 41B. The MR element layout area is circumferentially divided into eight sections. The MR elements R211, R212, R221, R222, R231, R232, R241, and R242 are located in the eight sections, respectively. Wiring for electrically connecting the plurality of MR elements to the plurality of ports is formed on the substrate 41B.

While FIG. 5A and FIG. 5B show the units 40A and 40B as separates units, the units 40A and 40B may be integrated with each other. In this case, the bridge circuits 14 and 16 may be arranged side by side on a single substrate. Alternatively, the substrates 41A and 41B may be stacked on each other in the Z direction.

Figure 6:
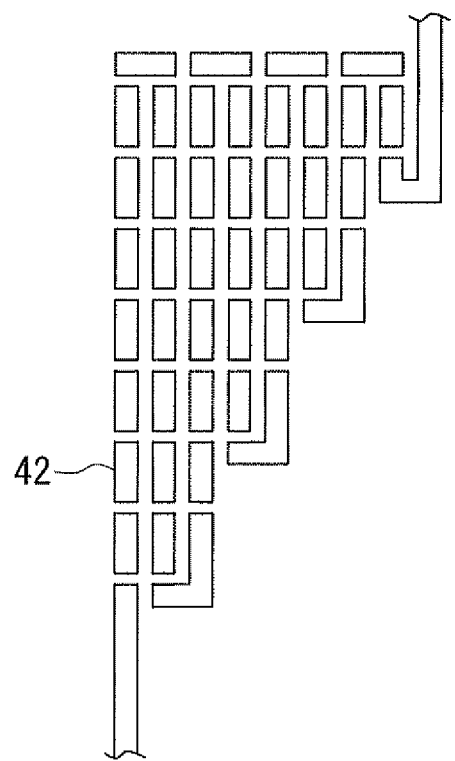
FIG. 6 is a plan view showing a plurality of lower electrodes that are provided in a section shown in FIG. 5A and FIG. 5B.
Figure 7:
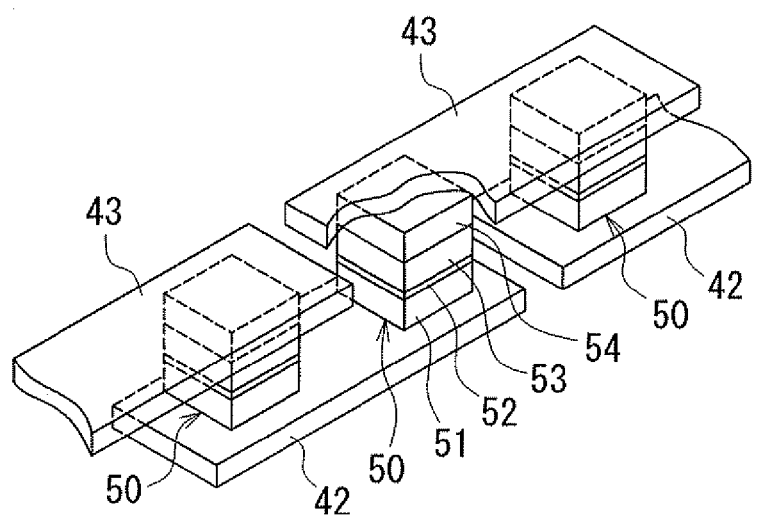
FIG. 7 is a perspective view showing a part of an MR element of FIG. 5A and FIG. 5B.

Reference is now made to FIG. 6 and FIG. 7 to describe an example of the configuration of an arbitrary MR element in the units 40A and 40B shown in FIG. 5A and FIG. 5B. FIG. 6 is a plan view showing a plurality of lower electrodes that are arranged in a section shown in FIG. 5A and FIG. 5B. FIG. 7 is a perspective view showing a part of an MR element of FIG. 5A and FIG. 5B. In this example, the MR element has a plurality of lower electrodes, a plurality of MR films, and a plurality of upper electrodes. In a section on the substrate 41A or 41B, the plurality of lower electrodes 42 are arranged as shown in FIG. 6. Each being oblong in shape, the plurality of lower electrodes 42 are arranged in a meandering configuration as a whole. Two lower electrodes 42 adjoining in the longitudinal direction of the lower electrodes 42 have a gap therebetween. As shown in FIG. 7, MR films 50 are provided on the top surfaces of the lower electrodes 42, near opposite ends in the longitudinal direction. Each MR film 50 includes a free layer 51, a nonmagnetic layer 52, a magnetization pinned layer 53, and an antiferromagnetic layer 54 that are stacked in this order, the free layer 51 being closest to the lower electrode 42. The free layer 51 is electrically connected to the lower electrode 42. The antiferromagnetic layer 54 is made of an antiferromagnetic material. The antiferromagnetic layer 54 is in exchange coupling with the magnetization pinned layer 53 so as to pin the magnetization direction of the magnetization pinned layer 53. The plurality of upper electrodes 43 are arranged over the plurality of MR films 50. Each upper electrode 43 is oblong in shape, and establishes electrical connection between the respective antiferromagnetic layers 54 of two adjoining MR films 50 that are arranged on two lower electrodes 42 adjoining in the longitudinal direction of the lower electrodes 42. Like the plurality of lower electrodes 42, the plurality of upper electrodes 43 are arranged in a meandering configuration as a whole. With such a configuration, the plurality of MR films 50 in the MR element shown in FIG. 6 and FIG. 7 are connected in series by the plurality of lower electrodes 42 and the plurality of upper electrodes 43. It should be appreciated that the layers 51 to 54 of the MR films 50 may be stacked in the order reverse to that shown in FIG. 7.

Now, a description will be given of the method by which the arithmetic circuit 13 calculates the detected angle value θs. In the present embodiment, the second direction D2, which serves as the reference direction when the second detection circuit 12 detects the rotating magnetic field MF, is orthogonal to the first direction D1, which serves as the reference direction when the first detection circuit 11 detects the rotating magnetic field MF. Ideally, the first signal S1 output from the first detection circuit 11 has a sine waveform that depends on the angle θ, and the second signal S2 output from the second detection circuit 12 has a cosine waveform that depends on the angle θ. In this case, the second signal S2 differs from the first signal S1 in phase by ¼ the signal period T, i.e., by π/2)(90°.

When the angle θ is greater than 0° and smaller than 180°, the first signal S1 has a positive value. When the angle θ is greater than 180° and smaller than 360°, the first signal S1 has a negative value. When the angle θ is equal to or greater than 0° and smaller than 90° and when the angle θ is greater than 270° and smaller than or equal to 360°, the second signal S2 has a positive value. When the angle θ is greater than 90° and smaller than 270°, the second signal S2 has a negative value. The first signal S1 is a signal that indicates the intensity of the component of the rotating magnetic field MF in the first direction D1. The second signal S2 is a signal that indicates the intensity of the component of the rotating magnetic field MF in the second direction D2.

Based on the first signal S1 and the second signal S2, the arithmetic circuit 13 calculates the detected angle value θs having a correspondence relationship with the angle θ that the direction DM of the rotating magnetic field MF in the reference position PR forms with respect to the reference direction DR. Specifically, for example, the arithmetic circuit 13 calculates θs by the equation (1) below. Note that "a tan" represents an arctangent.

$$\theta s = a\tan(S1/S2) \quad (1)$$

The term "a tan(S1/S2)" of the equation (1) represents the arctangent calculation for determining θs. Within the range of 360°, θs in the equation (1) has two solutions with a difference of 180° in value. Which of the two solutions of θs in the equation (1) is the true solution to θs can be determined from the combination of positive and negative signs on S1 and S2. More specifically, if S1 is positive in value, θs is greater than 0° and smaller than 180°. If S1 is negative in value, θs is greater than 180° and smaller than 360°. If S2 is positive in value, θs is equal to or greater than 0° and smaller than 90°, or is greater than 270° and smaller than or equal to 360°. If S2 is negative in value, θs is greater than 90° and smaller than 270°. The arithmetic circuit 13 determines θs in the range of 360°, using the equation (1) and based on the foregoing determination of the combination of positive and negative signs on S1 and S2.

The operation and effects of the rotating field sensor 1 will now be described. In the rotating field sensor 1, the resistance of each MR element periodically varies as the direction DM of the rotating magnetic field MF rotates. The periodic variation in the resistance of the MR element causes the potential difference across the MR element to vary periodically. Ideally, a periodically varying component of the resistance of the MR element has a sinusoidal waveform (including a sine waveform and a cosine waveform). Likewise, a periodically varying component of the potential difference across the MR element ideally has a sinusoidal waveform. In actuality, however, there are cases where the magnetization direction of the magnetization pinned layer of the MR element varies due to, for example, the influence of the rotating magnetic field MF, and where the magnetization direction of the free layer of the MR element does not coincide with the direction of the rotating magnetic field MF due to the influence of the shape anisotropy or coercivity of the free layer, for example. In such cases, the waveforms of the periodically varying components mentioned above are distorted from a sinusoidal curve.

In the present embodiment, the first signal S1 of the first detection circuit 11 and the second signal S2 of the second detection circuit 12 ideally have sinusoidal waveforms. However, if the waveform of the periodically varying component of the potential difference across each MR element is distorted as mentioned above, the waveforms of the first signal S1 and the second signal S2 are also distorted from a sinusoidal curve. As a result, the detected angle value θs calculated based on the first signal S1 and the second signal S2 may possibly include an angular error with respect to a theoretical value of the detected angle value θs that is expected when the direction DM of the rotating magnetic field MF rotates ideally.

The distorted waveform of the periodically varying component of the resistance of the MR element means that the periodically varying component of the resistance of the MR element includes not only an ideal sinusoidal component but also a harmonic component (hereinafter referred to as the resistance harmonic component). Likewise, the distorted waveform of the periodically varying component of the potential difference across the MR element means that the periodically varying component of the potential difference across the MR element includes not only an ideal sinusoidal component but also a harmonic component (hereinafter referred to as the potential difference harmonic component). The potential difference harmonic component results from the resistance harmonic component. The magnitude of the potential difference harmonic component is proportional to the magnitude of the resistance harmonic component.

In the present embodiment, the first detection circuit 11 includes the first and second MR element rows R11 and R12 connected in series, and the third and fourth MR element rows R13 and R14 connected in series. The second detection circuit 12 includes the first and second MR element rows R21 and R22 connected in series, and the third and fourth MR element rows R23 and R24 connected in series. Each MR element row is composed of a pair of MR elements connected in series. The magnetization directions of the magnetization pinned layers in two MR elements making up a pair form a predetermined relative angle 2φ other than 0° and 180°.

The potential difference across each MR element varies periodically as the direction DM of the rotating magnetic field MF rotates. The periodically varying component of the potential difference across each MR element may include a potential difference harmonic component in addition to an ideal sinusoidal component. In that case, a periodically varying component of the potential difference across an MR element row (a pair of MR elements) may also include a potential difference harmonic component in addition to an ideal sinusoidal component. The present embodiment allows the potential difference harmonic component produced in one of two MR elements making up a pair and that produced in the other of the two MR elements to be combined with each other, thereby making the potential difference harmonic component in an MR element row (a pair of MR elements) smaller than that in each single MR element. This will be discussed in more detail below.

First, a description will be made as to the resistance of the first MR element row R11 shown in FIG. 4. Here, let $R_{11}$, Ra, and Rb be the resistance of the first MR element row R11, the resistance of the MR element R111, and the resistance of the MR element R112, respectively. Each of the resistances Ra and Rb includes a periodic component which varies periodically as the direction DM of the rotating magnetic field MF rotates, and an initial component that is independent of the variation in the direction DM of the rotating magnetic field MF. The periodic component includes an ideal component, i.e., an ideal sinusoidal component, and a resistance harmonic component that distorts the waveform of the periodic component. The following description assumes that the ideal components are of the same amplitude in all the MR elements included in the rotating field sensor 1. It is also assumed that the initial components are equal in all the MR elements included in the rotating field sensor 1.

As shown in FIG. 4, the magnetization direction D111 of the magnetization pinned layer in the MR element R111 is the direction rotated clockwise from the first direction D1 by the angle φ. Accordingly, the ideal component and the resistance harmonic component of the MR element R111 are a periodic function of a variable θ with an initial phase of −φ. Letting α be the amplitude of the ideal component and β be the initial component, the resistance Ra of the MR element R111 is expressed by the following equation (2).

$$Ra = -\alpha \cdot \sin(\theta - \phi) - e(\theta - \phi) + \beta \quad (2)$$

In the equation (2), −α·sin(θ−φ) (represents the ideal component, and −e(θ−φ) represents the resistance harmonic component which is the periodic function of the variable θ with an initial phase of −φ.

As shown in FIG. 4, the magnetization direction D112 of the magnetization pinned layer in the MR element R112 is the direction rotated counterclockwise from the first direction D1 by the angle φ. Accordingly, the ideal component and the resistance harmonic component of the MR element R112 are a periodic function of the variable θ with an initial phase of φ. The resistance Rb of the MR element R112 is expressed by the following equation (3).

$$Rb = -\alpha \cdot \sin(\theta + \phi) - e(\theta + \phi) + \beta \quad (3)$$

In the equation (3), −α·sin(θ+φ) represents the ideal component, and −e(θ+φ) represents the resistance harmonic component which is the periodic function of the variable θ with an initial phase of φ.

Using the equations (2) and (3), the resistance $R_{11}$ of the first MR element row R11 is expressed by the following equation (4).

$$\begin{aligned} R_{11} &= Ra + Rb \\ &= -\alpha \cdot \sin(\theta - \phi) - e(\theta - \phi) + \beta - \\ &\quad \alpha \cdot \sin(\theta + \phi) - e(\theta + \phi) + \beta \\ &= -\alpha \cdot \{\sin(\theta - \phi) + \sin(\theta + \phi)\} - \\ &\quad \{e(\theta - \phi) + e(\theta + \phi)\} + 2\beta \\ &= -2\alpha \cdot \cos\phi \cdot \sin\theta - \{e(\theta - \phi) + e(\theta + \phi)\} + 2\beta \end{aligned} \quad (4)$$

Next, the resistance $R_{12}$ of the second MR element row R12 and the resistance $R_{13}$ of the third MR element row R13 will be described. As previously described, the magnetization direction of the magnetization pinned layers in the MR elements R121 and R131 is opposite to the magnetization direction D111 of the magnetization pinned layer in the MR element R111 shown in FIG. 4. The magnetization direction of the magnetization pinned layers in the MR elements R122 and R132 is opposite to the magnetization direction D112 of the magnetization pinned layer in the MR element R112 shown in FIG. 4. Therefore, the resistance $R_{12}$ of the second MR element row R12 and the resistance R13 of the third MR element row R13 are expressed by the following equation (5).

$$\begin{aligned} R_{12} &= R_{13} \\ &= \alpha \cdot \sin(\theta - \phi) + e(\theta - \phi) + \beta + \\ &\quad \alpha \cdot \sin(\theta + \phi) + e(\theta + \phi) + \beta \\ &= \alpha \cdot \{\sin(\theta - \phi) + \sin(\theta + \phi)\} + \\ &\quad \{e(\theta - \phi) + e(\theta + \phi)\} + 2\beta \\ &= 2\alpha \cdot \cos\phi \cdot \sin\theta + \{e(\theta - \phi) + e(\theta + \phi)\} + 2\beta \end{aligned} \quad (5)$$

Next, the resistance $R_{14}$ of the fourth MR element row R14 will be described. As previously described, the magnetization direction of the magnetization pinned layer in the MR element R141 is the same as the magnetization direction D111 of the magnetization pinned layer in the MR element R111 shown in FIG. 4. The magnetization direction of the magnetization pinned layer in the MR element R142 is the same as the magnetization direction D112 of the magnetization pinned layer in the MR element R112 shown in FIG. 4. Therefore, the resistance $R_{14}$ of the fourth MR element row R14 is equal to the resistance $R_{11}$ of the first MR element row R11 expressed by the equation (4).

Next, the resistance $R_{21}$ of the first MR element row R21 and the resistance $R_{24}$ of the fourth MR element row R24 will be described. As previously described, the magnetization direction of the magnetization pinned layers in the MR elements R211 and R241 is the direction rotated counterclockwise by 90° from the magnetization direction D112 of the magnetization pinned layer in the MR element R112 shown in FIG. 4. The magnetization direction of the magnetization pinned layers in the MR elements R212 and R242 is the direction rotated counterclockwise by 90° from the magnetization direction D111 of the magnetization pinned layer in the MR element R111 shown in FIG. 4. Therefore, the resistance R21 of the first MR element row R21 and the resistance $R_{24}$ of the fourth MR element row R24 are expressed by the following equation (6).

$$R_{21} = R_{24} \quad (6)$$
$$= -\alpha \cdot \cos(\theta + \phi) - f(\theta + \phi) + \beta -$$
$$\alpha \cdot \cos(\theta - \phi) - f(\theta - \phi) + \beta$$
$$= -\alpha \cdot \{\cos(\theta - \phi) + \cos(\theta + \phi)\} -$$
$$\{f(\theta - \phi) + f(\theta + \phi)\} + 2\beta$$
$$= -2\alpha \cdot \cos\phi \cdot \cos\theta - \{f(\theta - \phi) + f(\theta + \phi)\} + 2\beta$$

In the equation (6), f(θ−ϕ) represents the resistance harmonic component which is the periodic function of the variable θ with an initial phase of −ϕ, and f(θ+ϕ) represents the resistance harmonic component which is the periodic function of the variable θ with an initial phase of ϕ.

Next, the resistance $R_{22}$ of the second MR element row R22 and the resistance $R_{23}$ of the third MR element row R23 will be described. As previously described, the magnetization direction of the magnetization pinned layers in the MR elements R221 and R231 is opposite to the magnetization direction of the magnetization pinned layers in the MR elements R212 and R242. The magnetization direction of the magnetization pinned layers in the MR elements R222 and R232 is opposite to the magnetization direction of the magnetization pinned layers in the MR elements R211 and R241. Therefore, the resistance $R_{22}$ of the second MR element row R22 and the resistance R23 of the third MR element row R23 are expressed by the following equation (7).

$$R_{22} = R_{23} \quad (7)$$
$$= \alpha \cdot \cos(\theta - \phi) + f(\theta - \phi) + \beta +$$
$$\alpha \cdot \cos(\theta + \phi) + f(\theta + \phi) + \beta$$
$$= \alpha \cdot \{\cos(\theta - \phi) + \cos(\theta + \phi)\} +$$
$$\{f(\theta + \phi) + f(\theta - \phi)\} + 2\beta$$
$$= 2\alpha \cdot \cos\phi \cdot \cos\theta + \{f(\theta - \phi) + f(\theta + \phi)\} + 2\beta$$

As can be seen from the equations (4) to (7), the ideal component of the resistance of each MR element row is a sine or cosine function of the variable θ with an initial phase of 0. Now, consider a virtual MR element that has a magnetization pinned layer whose magnetization direction is the intermediate direction between the magnetization directions of the magnetization pinned layers of two MR elements forming an MR element row. The phase of the ideal component of the resistance of each MR element row is the same as that of the ideal component of the resistance of the aforementioned virtual MR element. Consequently, according to the present embodiment, the first detection circuit 11 is able to detect the intensity of the component of the rotating magnetic field MF in the first direction D1 and to output the first signal S1 indicating the intensity even if the first detection circuit 11 does not include any MR element that has a magnetization pinned layer whose magnetization direction is pinned in the first direction D1 or in the direction opposite to the first direction D1. Likewise, the second detection circuit 12 is able to detect the intensity of the component of the rotating magnetic field MF in the second direction D2 and to output the second signal S2 indicating the intensity even if the second detection circuit 12 does not include any MR element that has a magnetization pinned layer whose magnetization direction is pinned in the second direction D2 or in the direction opposite to the second direction D2.

Now, a description will be made as to the resistance harmonic component of an MR element row. Like the resistance of an MR element, the resistance of an MR element row includes a periodic component and an initial component. The periodic component includes an ideal component and a resistance harmonic component. The term −{e(θ−ϕ)+e(θ+ϕ)} in the equation (4) represents the resistance harmonic component in the first and fourth MR element rows R11 and R14. This is a combination of the resistance harmonic components −e(θ−ϕ) and −e(θ+ϕ) of two MR elements that form each of the MR element rows R11 and R14. The term e(θ+ϕ)+e(θ+ϕ) in the equation (5) represents the resistance harmonic component in the second and third MR element rows R12 and R13. This is a combination of the resistance harmonic components e(θ−ϕ) and e(θ+ϕ) of two MR elements that form each of the MR element rows R12 and R13. The term −{f(θ−ϕ)+f(θ+ϕ)} in the equation (6) represents the resistance harmonic component in the first and fourth MR element rows R21 and R24. This is a combination of the resistance harmonic components −f(θ−ϕ) and −f(θ+ϕ) of two MR elements that form each of the MR element rows R21 and R24. The term f(θ−ϕ)+f(θ+ϕ) in the equation (7) represents the resistance harmonic component in the second and third MR element rows R22 and R23. This is a combination of the resistance harmonic components f(θ−ϕ) and f(θ+ϕ) of two MR elements that form each of the MR element rows R22 and R23.

In the present embodiment, ϕ is selected so that the maximum absolute value of the resistance harmonic component of an MR element row is smaller than the maximum absolute value of the resistance harmonic component of an MR element. More specifically, ϕ is selected so that the maximum absolute value of {e(θ−ϕ)+e(θ+ϕ)} in the equations (4) and (5) is smaller than the maximum absolute value of e(θ−ϕ) and the maximum absolute value of e(θ+ϕ), and so that the maximum absolute value of {f(θ−ϕ)+f(θ+ϕ)} in the equations (6) and (7) is smaller than the maximum absolute value of f(θ−ϕ) and the maximum absolute value of f(θ+ϕ). Selecting ϕ in this manner allows the maximum absolute value of the potential difference harmonic component of an MR element row to be smaller than the maximum absolute value of the potential difference harmonic component of an MR element. Note that the potential difference harmonic component of an MR element row is a combination of the potential difference harmonic components of two MR elements that form the MR element row. In the present embodiment, in particular, ϕ is preferably selected so that the maximum absolute value of the resistance harmonic component of an MR element row is minimized.

As described above, the present embodiment allows the potential difference harmonic components in two MR elements that form an MR element row to be combined with each other, thereby making the potential difference harmonic component in the MR element row smaller than that in each single MR element. According to the present embodiment, it is thus possible to prevent the waveform of the first signal S1 of the first detection circuit 11 and the waveform of the second signal S2 of the second detection circuit 12 from being distorted from a sinusoidal curve. This makes it possible to reduce errors in the angle detected by the rotating field sensor 1.

Now, a description will be given of a specific example of ϕ at which the maximum absolute value of the resistance harmonic component of an MR element row is minimized. First, a case will be described where the resistance harmonic component of an MR element includes only a third harmonic component relative to the ideal component. Here, by way of example, letting γ represent the amplitude of the third harmonic component, $e(\theta-\phi)$ in the equations (4) and (5) will be expressed as $-\gamma\cdot\sin 3(\theta-\phi)$; $e(\theta+\phi)$ in the equations (4) and (5) will be expressed as $-\gamma\cdot\sin 3(\theta+\phi)$; $f(\theta-\phi)$ in the equations (6) and (7) will be expressed as $\gamma\cdot\cos 3(\theta-\phi)$; and $f(\theta+\phi)$ in the equations (6) and (7) will be expressed as $\gamma\cdot\cos 3(\theta+\phi)$. In this case, in the equations (4) and (5), it holds that $e(\theta+\phi)+e(\theta-\phi)=-2\gamma\cdot\cos 3\phi\cdot\sin 3\theta$. Furthermore, in the equations (6) and (7), it holds that $f(\theta+\phi)+f(\theta-\phi)=2\gamma\cdot\cos 3\phi\cdot\cos 3\theta$. Here, if we set $\phi=\pi/6$ (30°), then $e(\theta+\phi)+e(\theta-\phi)$ in the equations (4) and (5) and $f(\theta+\phi)+f(\theta-\phi)$ in the equations (6) and (7) are both zero. Accordingly, if the resistance harmonic component of an MR element includes only the third harmonic component, letting $\phi=\pi/6$ makes the maximum absolute value of the resistance harmonic component of an MR element row be zero (the minimum).

Figure 8:
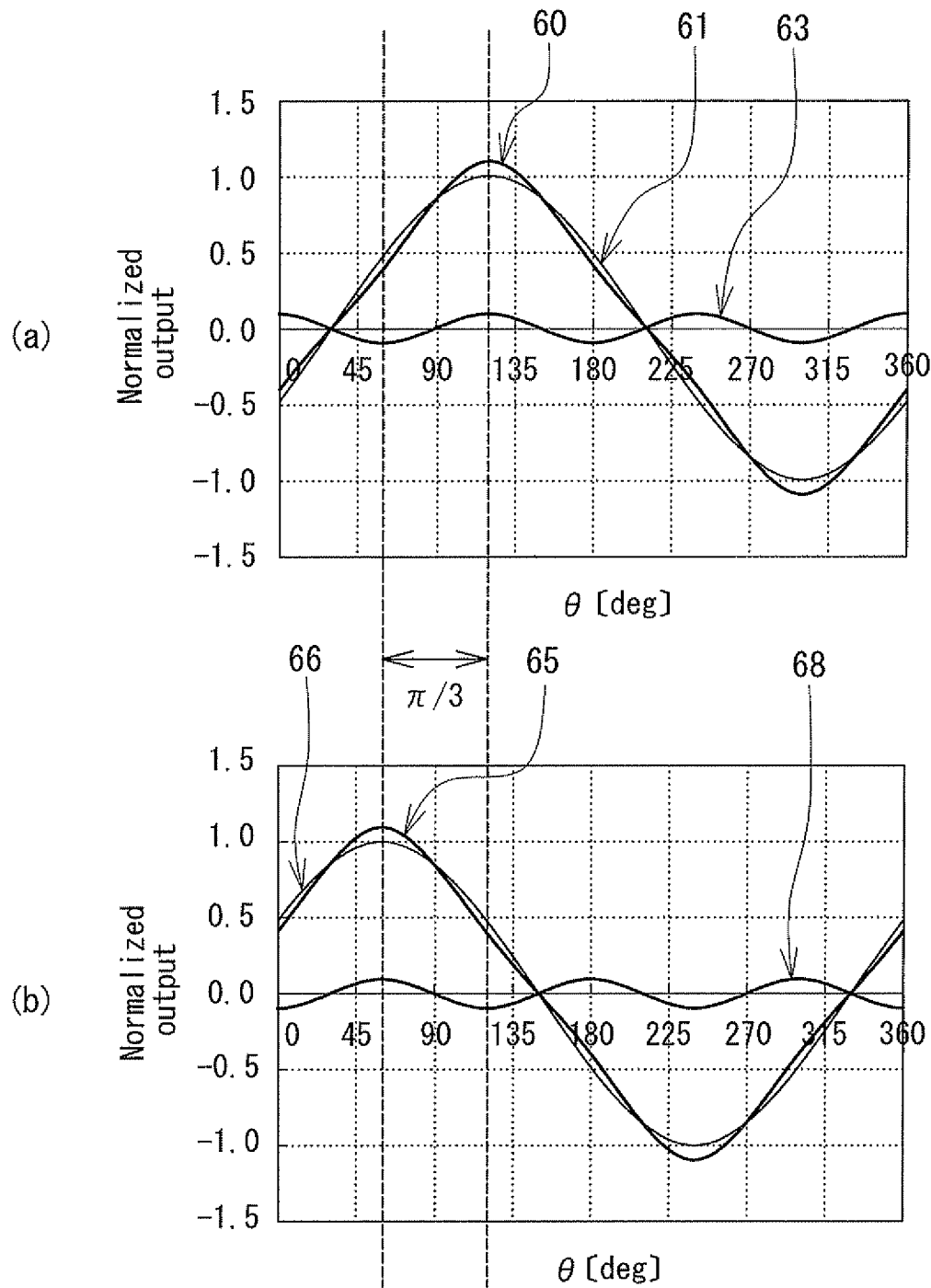
FIG. 8 is a waveform chart showing an example of the waveform of a periodically varying component of the potential difference across each of two MR elements making up a pair in the first embodiment of the invention.
Figure 9:
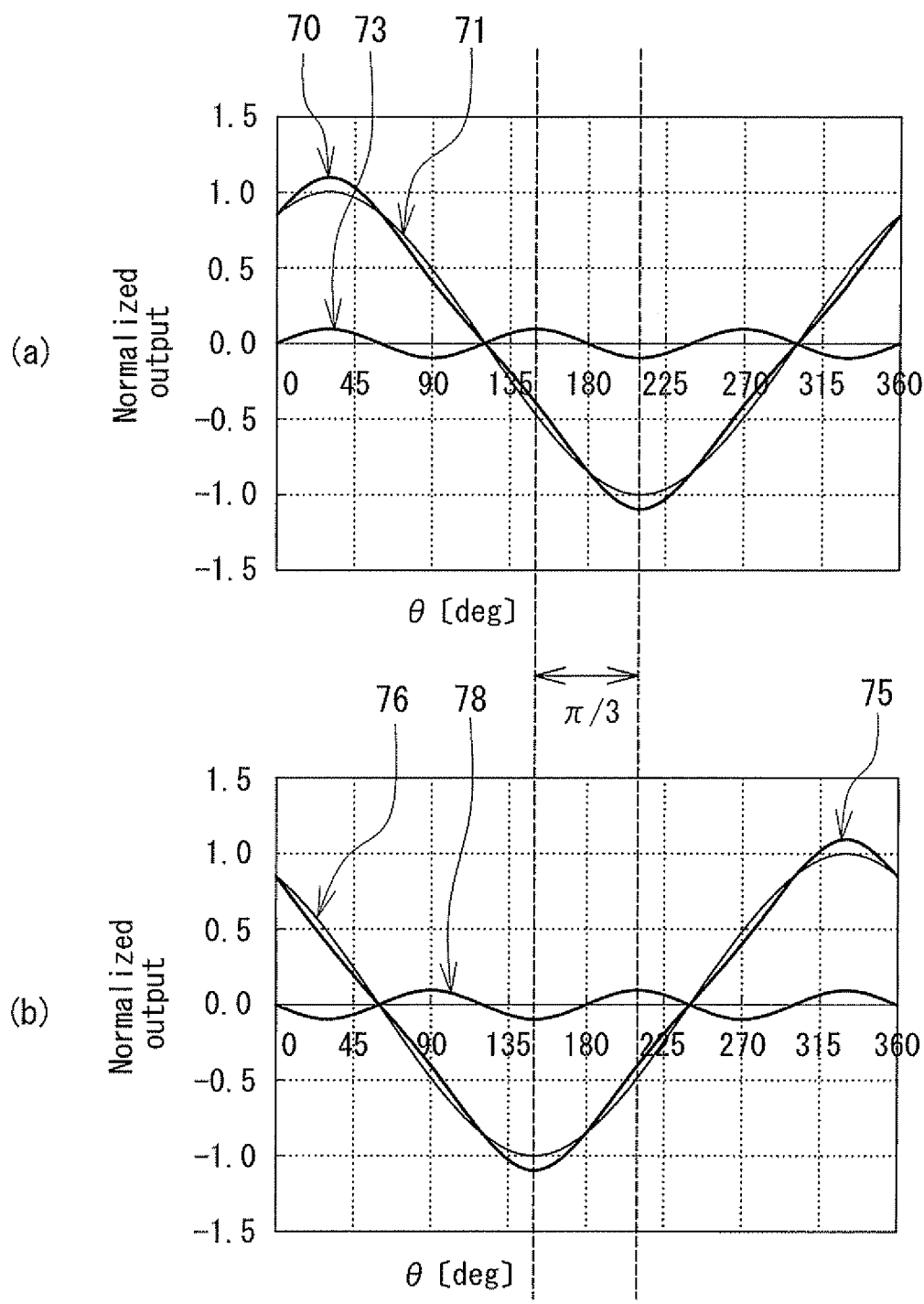
FIG. 9 is a waveform chart showing an example of the waveform of a periodically varying component of the potential difference across each of two MR elements making up another pair in the first embodiment of the invention.

Each of FIG. 8 and FIG. 9 is a waveform chart showing an example of the waveform of the periodically varying component of the potential difference across an MR element. The waveforms shown in FIG. 8 and FIG. 9 are those obtained in the case where the resistance harmonic component of the MR element includes only the third harmonic component. FIG. 8 and FIG. 9 illustrate that letting $\phi=\pi/6$ leads to a reduction in the potential difference harmonic component in an MR element row. Portion (a) of FIG. 8 shows the waveform of the periodically varying component of the potential difference across the MR element R121. Portion (b) of FIG. 8 shows the waveform of the periodically varying component of the potential difference across the MR element R122. Portion (a) of FIG. 9 shows the waveform of the periodically varying component of the potential difference across the MR element R221. Portion (b) of FIG. 9 shows the waveform of the periodically varying component of the potential difference across the MR element R222. In FIG. 8 and FIG. 9, the horizontal axis represents the angle θ, while the vertical axis represents the normalized output. The normalized output on the vertical axis indicates the values of the potential difference where the maximum value of the ideal sinusoidal component included in the periodically varying component of the potential difference is assumed as 1. Reference numerals 60, 65, 70, and 75 indicate the waveforms of the periodically varying components of the potential differences across the respective MR elements. Reference numerals 61, 66, 71, and 76 each indicate an ideal sinusoidal curve. Reference numerals 63, 68, 73, and 78 indicate the waveforms of the potential difference harmonic components corresponding to the resistance harmonic components in the respective MR elements. The waveforms shown in FIG. 8 and FIG. 9 were generated by simulation.

The periodically varying components (reference numerals 60, 65, 70, and 75) of the potential differences have a period equal to the signal period T of the first and second signals S1 and S2. In the examples shown in FIG. 8 and FIG. 9, the potential difference harmonic components (reference numerals 63, 68, 73, and 78) corresponding to the resistance harmonic components (the third harmonic components) in the MR elements vary with a period of ⅓ the signal period T, i.e., with a period of $2\pi/3$ (120°) in synchronization with the periodically varying components of the potential differences. In this case, the waveforms of the periodically varying components of the potential differences are distorted as shown in FIG. 8 and FIG. 9.

Note that examples where the waveform of the periodically varying component of the potential difference is distorted from a sinusoidal curve due to the third resistance harmonic component are not limited to those shown in FIG. 8 and FIG. 9. In the examples shown in FIG. 8 and FIG. 9, the waveforms of the periodically varying components of the potential differences are each distorted from the ideal sinusoidal curve so as to approach a triangular waveform. Unlike the examples shown in FIG. 8 and FIG. 9, however, the third resistance harmonic component may also cause the waveform of the periodically varying component of the potential difference to be distorted from the ideal sinusoidal curve to approach a rectangular waveform. A description will be made later as to an example where the resistance harmonic component of an MR element includes a second harmonic component.

As described above, if the resistance harmonic component of an MR element includes only the third harmonic component, the maximum absolute value of the resistance harmonic component of an MR element row is minimized when $\phi=\pi/6$ (30°). FIG. 8 and FIG. 9 show that letting $\phi=\pi/6$ leads to a reduction in the potential difference harmonic component in an MR element row. As shown in FIG. 8, the potential difference harmonic component of the MR element R121 (reference numeral 63) and the potential difference harmonic component of the MR element R122 (reference numeral 68) have opposite phases. In the present embodiment, the MR elements R121 and R122 are connected in series between the first end and the second end of the second MR element row R12. This causes the potential difference harmonic components of the MR elements R121 and R122 to cancel each other out in the second MR element row R12. Consequently, as compared with the MR elements R121 and R122, the second MR element row R12 achieves a reduction in the potential difference harmonic component.

As shown in FIG. 9, the potential difference harmonic component of the MR element R221 (reference numeral 73) and the potential difference harmonic component of the MR element R222 (reference numeral 78) have opposite phases. In the present embodiment, the MR elements R221 and R222 are connected in series between the first end and the second end of the second MR element row R22. This causes the potential difference harmonic components of the MR elements R221 and R122 to cancel each other out in the second MR element row R22. Consequently, as compared with the MR elements R221 and R222, the second MR element row R22 achieves a reduction in the potential difference harmonic component.

Figure 10:
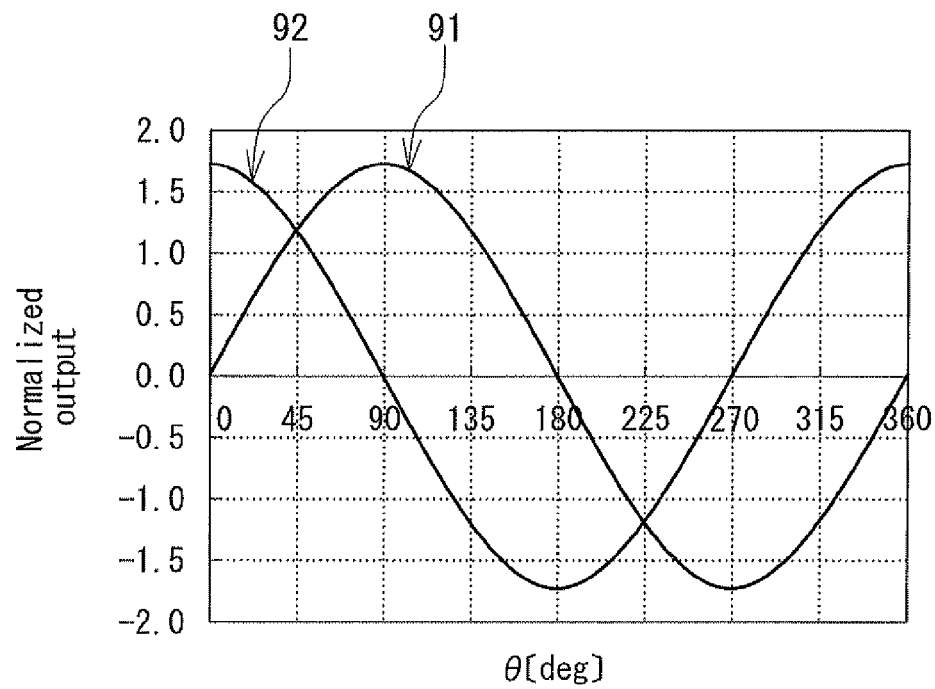
FIG. 10 is a waveform chart showing the waveform of a periodically varying component of the potential difference across a pair of MR elements in the first embodiment of the invention.

FIG. 10 is a waveform chart showing the waveform of a periodically varying component of the potential difference across a pair of MR elements. In FIG. 10, the horizontal axis indicates the angle θ, while the vertical axis indicates the normalized output in like manner with FIG. 8 and FIG. 9. Reference numeral 91 indicates the waveform of the periodically varying component of the potential difference across a pair of MR elements R121 and R122, i.e., the potential difference between the first and second ends of the second MR element row R12. Reference numeral 92 indicates the waveform of the periodically varying component of the potential difference across a pair of MR elements R221 and R222, i.e., the potential difference between the first and second ends of the second MR element row R22. As shown in FIG. 10, because of the cancellation of the potential difference harmonic components of the MR elements R121 and R122, the periodically varying component of the potential difference denoted by reference numeral 91 has a sinusoidal waveform with reduced distortion, i.e., with a reduced potential difference harmonic component. Likewise, because of the cancellation of the potential difference harmonic components of the MR elements R221 and R222, the periodically varying component of the potential difference denoted by reference numeral 92 has a sinusoidal waveform with reduced distortion, i.e., with a reduced potential difference harmonic component.

It is also possible for the other MR element rows to achieve a reduction in the potential difference harmonic component in the MR element row as compared with that of each individual MR element constituting the MR element row.

Now, a description will be made as to the case where the resistance harmonic component of an MR element includes second and third harmonic components relative to the ideal component. The following describes the results of a first simulation that was carried out for determining the value of $\phi$ at which the magnitude of the resistance harmonic component in an MR element row is minimized in the case where the resistance harmonic component of an MR element includes the second and third harmonic components. Such a value of $\phi$ will hereinafter be represented by $\phi t$. In the first simulation, the ratio of the amplitude of the second harmonic component and the ratio of the amplitude of the third harmonic component to the amplitude of the ideal component were varied to determine $\phi t$. Here, the ratio of the amplitude of the second harmonic component to the amplitude of the ideal component will be represented by p1 and the ratio of the amplitude of the third harmonic component to the amplitude of the ideal component will be represented by p2. In the first simulation, the ratio p1 of the amplitude of the second harmonic component was varied in increments of 1% within the range from 0% to 10%. On the other hand, the ratio p2 of the amplitude of the third harmonic component was varied in increments of 0.1% within the range from 0.1% to 1%. Then, $\phi t$ was determined for all the combinations of p1 and p2. More specifically, $e(\theta+\phi)+e(\theta-\phi)$ in the equations (4) and (5) and $f(\theta+\phi)+f(\theta-\phi)$ in the equations (6) and (7) were each expressed as a function that includes the second harmonic component and the third harmonic component, and then $\phi$ at which the maximum absolute value of these functions is minimized was determined as $\phi t$.

Figure 11:
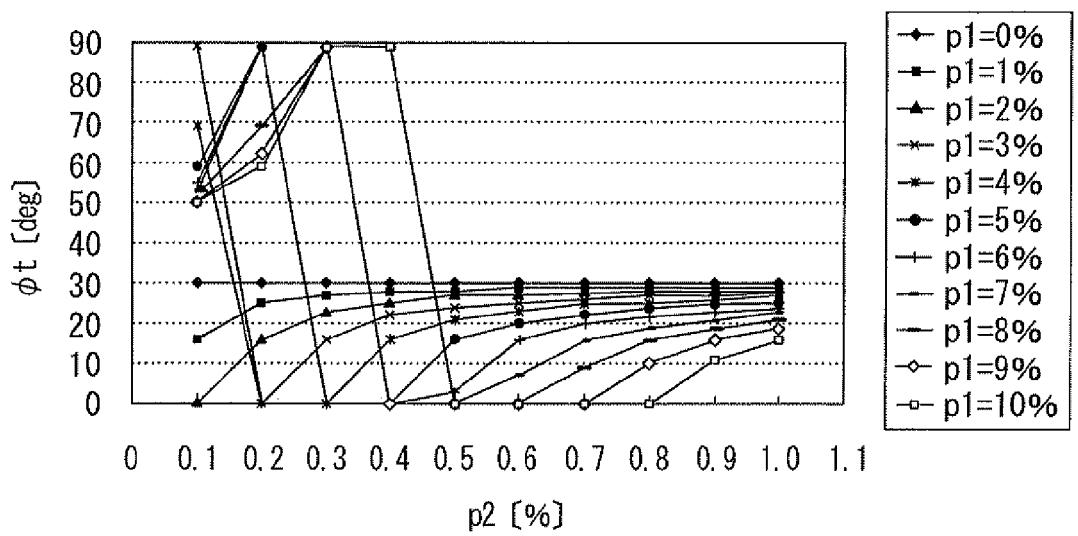
FIG. 11 is an explanatory diagram showing the angle at which the resistance harmonic component of an MR element row determined by a first simulation becomes minimum in magnitude.

FIG. 11 shows the values of $\phi t$ determined by the first simulation. In FIG. 11, the horizontal axis indicates the ratio p2 of the amplitude of the third harmonic component, while the vertical axis indicates $\phi t$. FIG. 11 shows that when the ratio p1 of the amplitude of the second harmonic component is 0% (when no second harmonic component is included), $\phi t$ is 30° ($\pi/6$) regardless of the ratio p2 of the amplitude of the third harmonic component. FIG. 11 also shows that when p1 is other than 0% and p2 is somewhat high, $\phi t$ becomes closer to 30° ($\pi/6$) with increasing P2 and with decreasing P1.

Now, a description will be given of simulation results showing that the present embodiment allows reducing the error in the angle detected by the rotating field sensor 1. The following describes the results of a second simulation in which a rotating field sensor of a comparative example and the rotating field sensor 1 according to the present embodiment were compared in terms of angular error. The configuration of the rotating field sensor of the comparative example will be described first. Like the rotating field sensor 1 according to the present embodiment, the rotating field sensor of the comparative example includes first and second detection circuits and an arithmetic circuit. The first detection circuit of the comparative example has a first bridge circuit composed of four MR elements, instead of the bridge circuit 14 shown in FIG. 3. The second detection circuit of the comparative example has a second bridge circuit composed of four MR elements, instead of the bridge circuit 16 shown in FIG. 3. Each of the magnetization pinned layers in the four MR elements forming the first bridge circuit has a magnetization direction the same as or opposite to the first direction D1. Each of the magnetization pinned layers in the four MR elements forming the second bridge circuit has a magnetization direction the same as or opposite to the second direction D2. The remainder of the configuration of the rotating field sensor of the comparative example is the same as that of the rotating field sensor 1 according to the present embodiment.

In the second simulation, the ratio p1 of the amplitude of the second harmonic component and the ratio p2 of the amplitude of the third harmonic component were varied in the same manner as in the first simulation to determine an angular error included in the detected angle value $\theta s$ for each of the rotating field sensor of the comparative example and the rotating field sensor 1 according to the present embodiment. More specifically, the angular error was identified as the difference between the detected angle value $\theta s$ calculated by the equation (1) and a theoretical value of the detected angle value $\theta s$ that is expected when the direction DM of the rotating magnetic field MF rotates ideally. Note that the resistance expressed by the equations (4) to (7) with $\phi=0$ was employed as the resistance of the MR element in the rotating field sensor of the comparative example. For the rotating field sensor 1 according to the embodiment, $\phi t$ determined by the first simulation was applied. More specifically, the resistance expressed by the equations (4) to (7) with $\phi=\phi t$ was employed as the resistance of the MR element row in the rotating field sensor 1 according to the embodiment.

Figure 12:
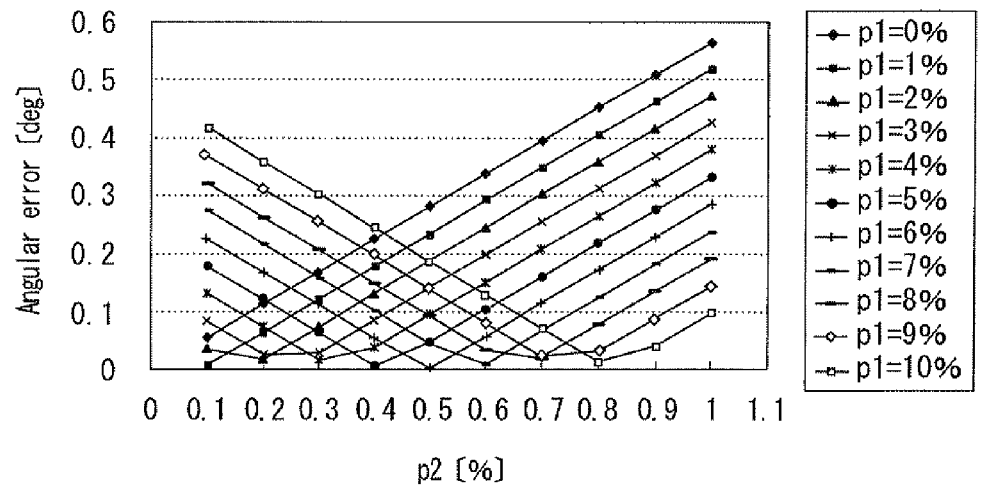
FIG. 12 is an explanatory diagram showing an angular error of a rotating field sensor of a comparative example determined by a second simulation.
Figure 13:
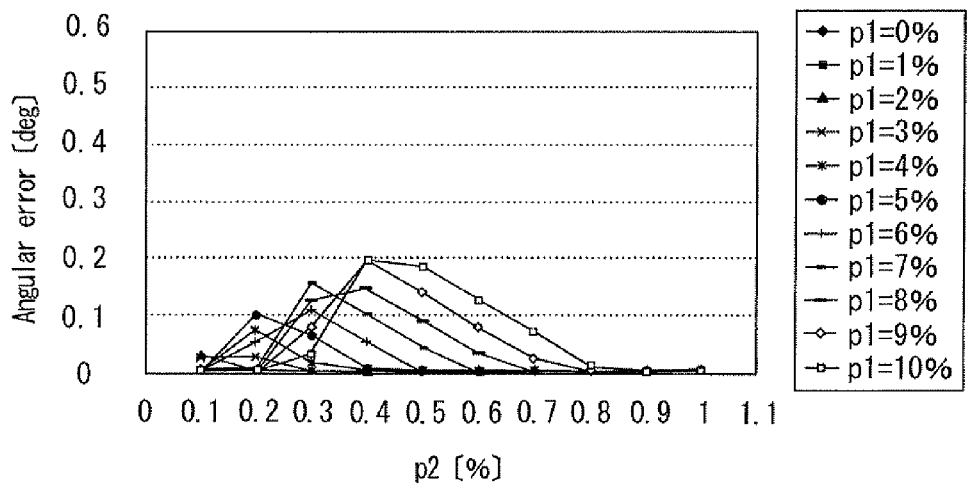
FIG. 13 is an explanatory diagram showing an angular error of the rotating field sensor according to the first embodiment of the invention determined by the second simulation.

FIG. 12 and FIG. 13 show the angular errors determined by the second simulation. FIG. 12 shows the angular error for the rotating field sensor of the comparative example. FIG. 13 shows the angular error for the rotating field sensor 1 according to the present embodiment. In FIG. 12 and FIG. 13, the horizontal axis indicates the ratio p2 of the third harmonic component, and the vertical axis indicates $\phi t$. FIG. 12 and FIG. 13 show that where the ratio p1 of the amplitude of the second harmonic component and the ratio p2 of the third harmonic component are varied, the angular error caused by the rotating field sensor of the comparative example is 0.6° or less, whereas the angular error caused by the rotating field sensor 1 according to the embodiment is 0.2° or less. The second simulation shows that according to the present embodiment, selecting the optimum value of $\phi$, i.e., $\phi t$ makes it possible to reduce the error in the angle detected by the rotating field sensor 1. For the actual rotating field sensor 1, the optimum value of $\phi$ may be selected according to the service conditions in which the rotating field sensor 1 is used.

Figure 14:
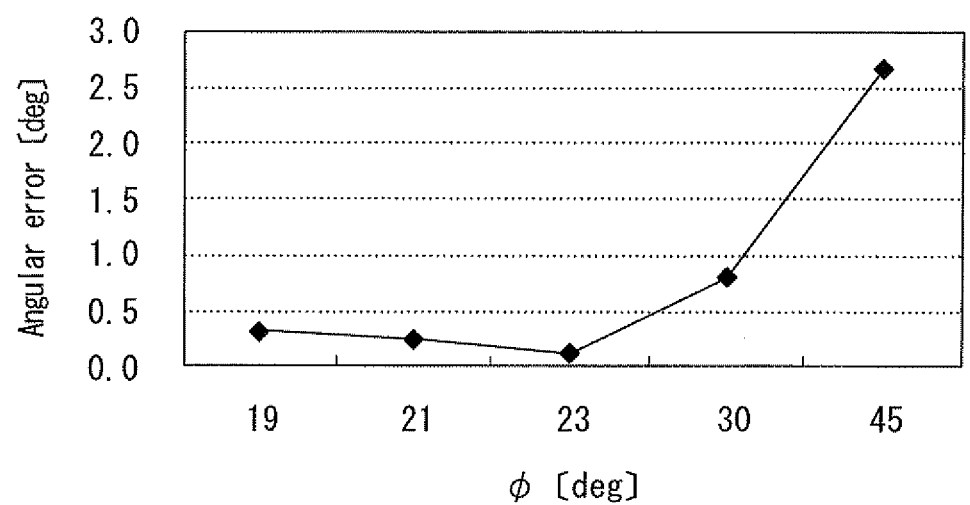
FIG. 14 is a characteristic chart illustrating an example of the relationship between the angular error and the relative angle that is formed by the magnetization directions of the magnetization pinned layers in two MR elements making up a pair in the first embodiment of the invention.

Now, a description will be given of the results of first and second experiments that were carried out to verify the results of the aforementioned second simulation. In the first experiment, a plurality of rotating field sensors 1 with different values of $\phi$ were actually fabricated to examine the relationship between $\phi$ and the angular error. In the first experiment, five rotating field sensors 1 were fabricated with $\phi$ set to 19°, 21°, 23°, 30°, and 45° to examine the maximum angular error value. The intensity of the rotating magnetic field MF was set to 400 Oe (1 Oe=79.6 A/m) in the first experiment. FIG. 14 shows the results of the first experiment. In FIG. 14, the horizontal axis indicates $\phi$ and the vertical axis indicates the angular error. FIG. 14 shows that the angular error differs depending on $\phi$ and can be reduced by selecting the optimum value of $\phi$. Of the five rotating field sensors 1 fabricated for the first experiment, the one with $\phi$ of 23° was found to have the minimum angular error.

Figure 15:
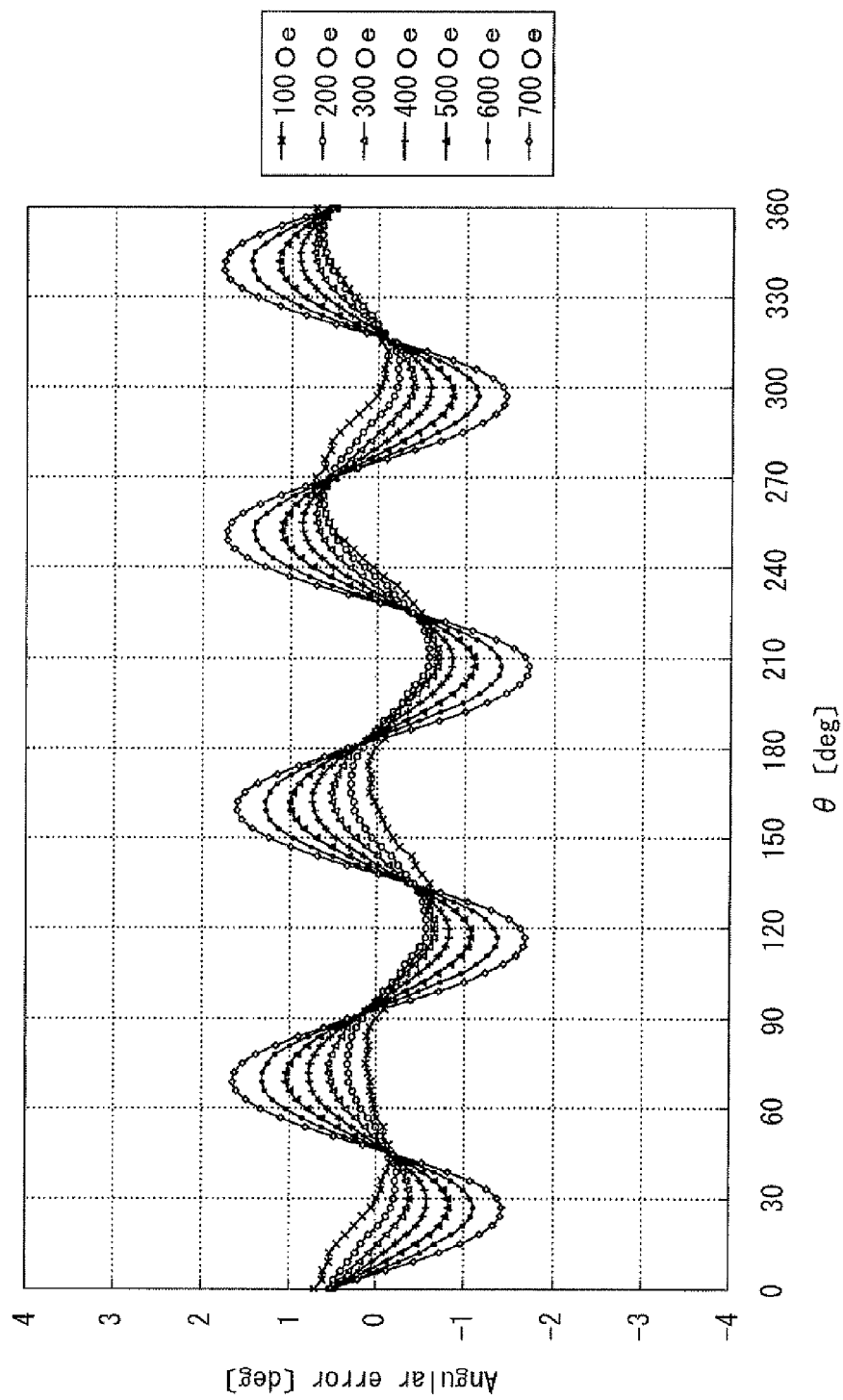
FIG. 15 is a waveform chart showing the waveform of the angular error of the rotating field sensor of the comparative example.
Figure 16:
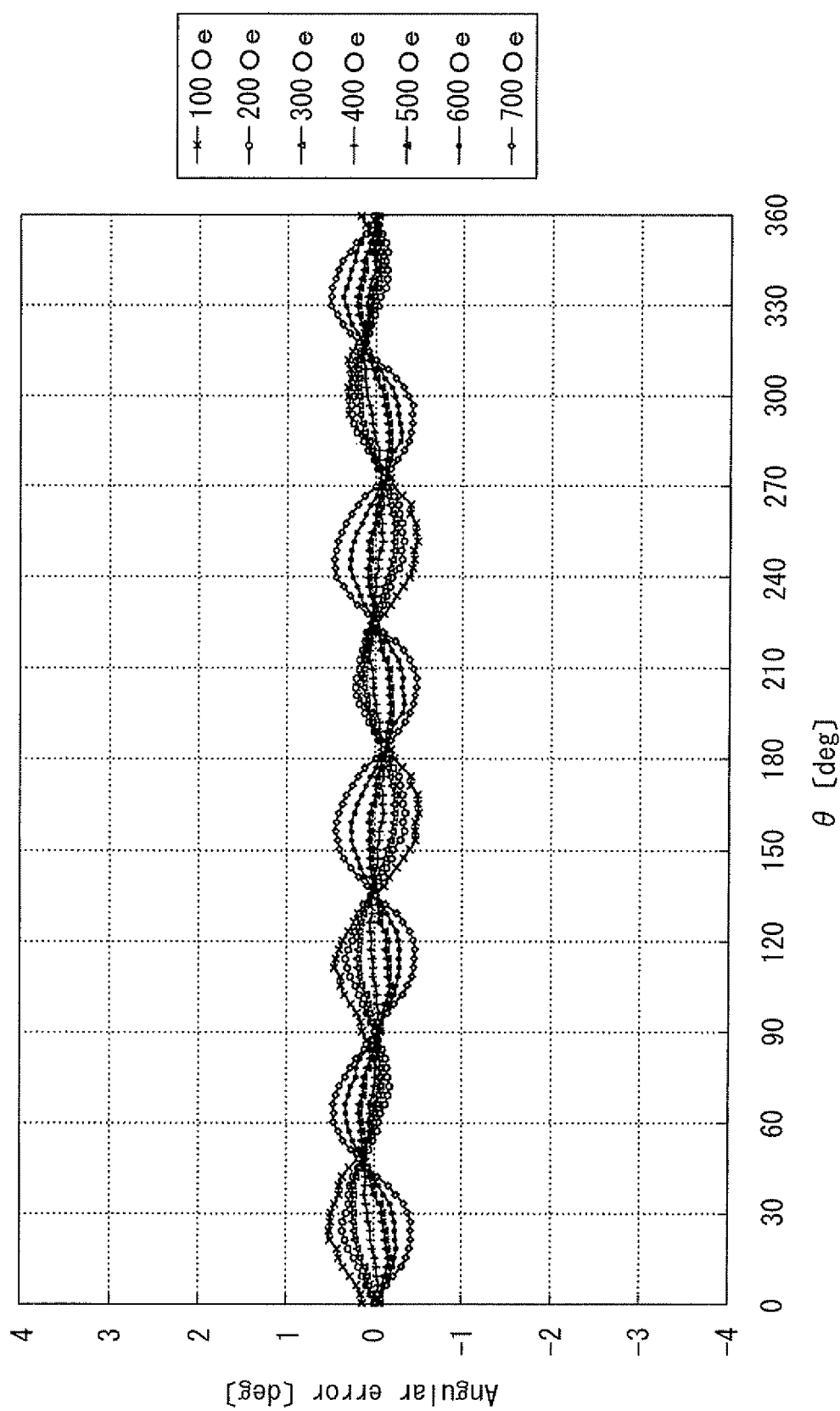
FIG. 16 is a waveform chart showing the waveform of the angular error that results when a relative angle of 46° is formed by the magnetization directions of the magnetization pinned layers in two MR elements making up a pair in the first embodiment of the invention.

In the second experiment, the rotating field sensor 1 which was fabricated for the first experiment with $\phi=23°$ (hereinafter referred to as the rotating field sensor 1 of the practical example) and a rotating field sensor of a comparative example were used to examine the relationship between the intensity of the rotating magnetic field MF and the angular error. The rotating field sensor of the comparative example used for the second experiment has the same configuration as that of the rotating field sensor of the comparative example used for the second simulation. In the second experiment, for the rotating field sensor of the comparative example and the rotating field sensor 1 of the practical example, the intensity of the rotating magnetic field MF was varied in increments of 100 Oe within the range from 100 Oe to 700 Oe to examine the angular error at each intensity. FIG. 15 and FIG. 16 show the results of the second experiment. FIG. 15 shows the results for the rotating field sensor of the comparative example, while FIG. 16 shows the results for the rotating field sensor 1 of the practical example. In FIG. 15 and FIG. 16, the horizontal axis indicates the angle θ and the vertical axis indicates the angular error. FIG. 15 and FIG. 16 indicate that the rotating field sensor 1 of the practical example shows smaller angular errors than those of the rotating field sensor of the comparative example over a wide range of intensity of the rotating magnetic field MF. The second experiment shows that selecting the optimum value of φ allows a reduction in the angular error regardless of the intensity of the rotating magnetic field MF.

Other effects provided by the present embodiment will now be described. In the present embodiment, the first detection circuit 11 detects the intensity of the component of the rotating magnetic field MF in the first direction D1 and outputs the first signal S1 indicating the intensity. However, none of the first to fourth MR element rows R11, R12, R13, and R14 in the first detection circuit 11 includes any MR element that has a magnetization pinned layer whose magnetization direction is pinned in the first direction D1 or in the direction opposite to the first direction D1. The second detection circuit 12 detects the intensity of the component of the rotating magnetic field MF in the second direction D2 and outputs the second signal S2 indicating the intensity. However, none of the first to fourth MR element rows R21, R22, R23, and R24 in the second detection circuit 12 includes any MR element that has a magnetization pinned layer whose magnetization direction is pinned in the second direction D2 or in the direction opposite to the second direction D2. As compared with a case where the first detection circuit 11 includes an MR element that has a magnetization pinned layer whose magnetization direction is pinned in the first direction D1 or in the direction opposite to the first direction D1 while the second detection circuit 12 includes an MR element that has a magnetization pinned layer whose magnetization direction is pinned in the second direction D2 or in the direction opposite to the second direction D2, the present embodiment makes it possible to reduce the number of MR elements to be included in each of the detection circuits 11 and 12, and makes it easier to design the detection circuits 11 and 12. As such, the present embodiment provides a simplified configuration while allowing a reduction in the error in the detected angle.

To reduce the angular error of a rotating field sensor, the following method is also conceivable. The method employs a third detection circuit and a fourth detection circuit in addition to the first and second detection circuits of the aforementioned comparative example. The third detection circuit has the same configuration as that of the first detection circuit of the comparative example, and outputs a signal that has a predetermined phase difference with respect to the output signal of the first detection circuit of the comparative example. The fourth detection circuit has the same configuration as that of the second detection circuit of the comparative example, and outputs a signal that has a predetermined phase difference with respect to the output signal of the second detection circuit of the comparative example. The detected angle value is calculated based on a signal obtained by combining the output signals of the first and third detection circuits and a signal obtained by combining the output signals of the second and fourth detection circuits. This method, however, has the problem that the presence of the four detection circuits increases the rotating field sensor in size, and the problem that the operation for processing the output signals of the four detection circuits also increases in complexity.

In contrast to this, the present embodiment does not require the aforementioned third and fourth detection circuits and allows reducing the potential difference harmonic component in each pair of MR elements (each MR element row). As compared with the aforementioned method, the present embodiment thus allows the rotating field sensor to be smaller in size and also reduces computational complexity.

Furthermore, in the present embodiment, two MR elements making up a pair can be formed to have the same configuration except the magnetization direction of the magnetization pinned layer. For this reason, even if the potential difference harmonic component of each MR element is a function of temperature, variations caused by the temperature in the respective potential difference harmonic components of the two MR elements are equalized. Thus, when the potential difference harmonic components of the two MR elements are combined together, the potential difference harmonic component in the MR element row becomes smaller than that of each single MR element. Consequently, according to the present embodiment, it is eventually possible to obtain a detected angle value with less temperature-based error variations.

Modification Examples

Figure 17:
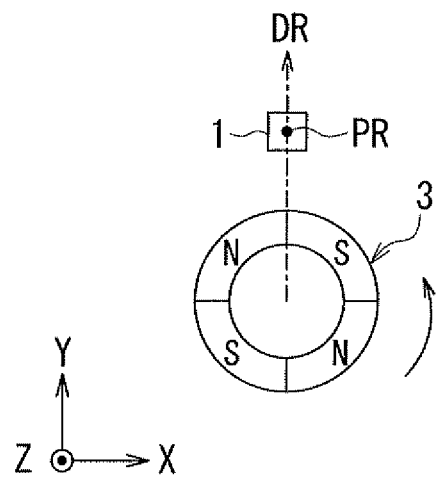
FIG. 17 is an explanatory diagram showing the configuration of a rotating field sensor of a first modification example of the first embodiment of the invention.
Figure 18:
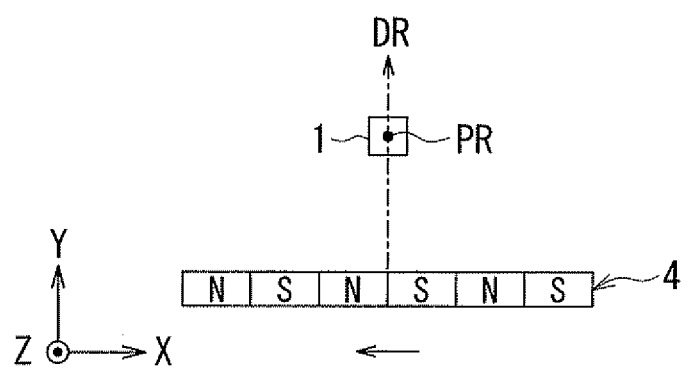
FIG. 18 is an explanatory diagram showing the configuration of a rotating field sensor of a second modification example of the first embodiment of the invention.

Reference is now made to FIG. 17 and FIG. 18 to describe a first and a second modification example of the present embodiment. The first modification example will be described first, with reference to FIG. 17. FIG. 17 is an explanatory diagram showing the configuration of a rotating field sensor of the first modification example. In FIG. 17, a magnet 3 including one or more pairs of N and S poles alternately arranged in a ring shape is shown as an example of the means for generating a rotating magnetic field whose direction rotates. In the example shown in FIG. 17, the magnet 3 includes two pairs of N and S poles. The rotating field sensor 1 of the first modification example detects the direction of the rotating magnetic field generated from the outer periphery of the magnet 3. In the example shown in FIG. 17, the plane of the drawing of FIG. 17 is an XY plane, and the direction perpendicular to the plane is the Z direction. The N and S poles of the magnet 3 are arranged symmetrically with respect to the center of rotation parallel to the Z direction. The magnet 3 rotates about the center of rotation. As a result, a rotating magnetic field occurs based on the magnetic field generated by the magnet 3. The rotating magnetic field rotates about the center of rotation (the Z direction). In the example shown in FIG. 17, the magnet 3 rotates in a counterclockwise direction, and the rotating magnetic field rotates in a clockwise direction.

In the example shown in FIG. 17, the reference direction DR is set to a radial direction of the magnet 3. Although not shown in the drawings, the rotating field sensor 1 detects a component of the rotating magnetic field in a first direction and a component of the rotating magnetic field in a second direction. The relationships between the reference direction DR and the first and second directions are the same as the relationships between the reference direction DR and the first and second directions D1 and D2 shown in FIG. 2.

The second modification example of the embodiment will now be described with reference to FIG. 18. FIG. 18 is an explanatory diagram showing the configuration of a rotating field sensor of the second modification example. In FIG. 18, a magnet 4 including a plurality of pairs of N and S poles alternately arranged in a line is shown as an example of the means for generating a rotating magnetic field whose direction rotates. The rotating field sensor 1 of the second modification example detects the direction of the rotating magnetic field generated from the outer periphery of the magnet 4. In the example shown in FIG. 18, the plane of the drawing of FIG. 18 is an XY plane, and the direction perpendicular to the plane is the Z direction. The magnet 4 makes a straight movement in its longitudinal direction along with a straight movement of an object. As a result, a rotating magnetic field occurs based on the magnetic field generated by the magnet 4. The rotating magnetic field rotates about the Z direction.

In the example shown in FIG. 18, the reference direction DR is set to a direction orthogonal to the direction of movement of the magnet 4 in the XY plane. Although not shown in the drawings, the rotating field sensor 1 detects a component of the rotating magnetic field in a first direction and a component of the rotating magnetic field in a second direction. The relationships between the reference direction DR and the first and second directions are the same as the relationships between the reference direction DR and the first and second directions D1 and D2 shown in FIG. 2.

Second Embodiment

A rotating field sensor according to a second embodiment of the invention will now be described. The rotating field sensor according to the second embodiment has the same circuit configuration as that of the rotating field sensor 1 according to the first embodiment shown in FIG. 3.

As described in relation to the first embodiment, in the first detection circuit 11, the magnetization directions of the magnetization pinned layers in the MR elements R131 and R132 forming the third MR element row R13 are the same as those of the magnetization pinned layers in the MR elements R121 and R122 forming the second MR element row R12. Furthermore, in the first detection circuit 11, the magnetization directions of the magnetization pinned layers in the MR elements R141 and R142 forming the fourth MR element row R14 are the same as those of the magnetization pinned layers in the MR elements R111 and R112 forming the first MR element row R11.

In the second detection circuit 12, the magnetization directions of the magnetization pinned layers in the MR elements R231 and R232 forming the third MR element row R23 are the same as those of the magnetization pinned layers in the MR elements R221 and R222 forming the second MR element row R22. Furthermore, in the second detection circuit 12, the magnetization directions of the magnetization pinned layers in the MR elements R241 and R242 forming the fourth MR element row R24 are the same as those of the magnetization pinned layers in the MR elements R211 and R212 forming the first MR element row R21.

In the present embodiment, MR elements that are included in two respective different MR element rows and provided with magnetization pinned layers having the same magnetization direction are disposed adjacent to each other. More specifically, in the first detection circuit 11, MR elements that are included in the first MR element row R11 and the fourth MR element row R14 respectively and provided with magnetization pinned layers having the same magnetization direction are disposed adjacent to each other, while MR elements that are included in the second MR element row R12 and the third MR element row R13 respectively and provided with magnetization pinned layers having the same magnetization direction are disposed adjacent to each other. In the second detection circuit 12, MR elements that are included in the first MR element row R21 and the fourth MR element row R24 respectively and provided with magnetization pinned layers having the same magnetization direction are disposed adjacent to each other, while MR elements that are included in the second MR element row R22 and the third MR element row R23 respectively and provided with magnetization pinned layers having the same magnetization direction are disposed adjacent to each other.

Figure 19:
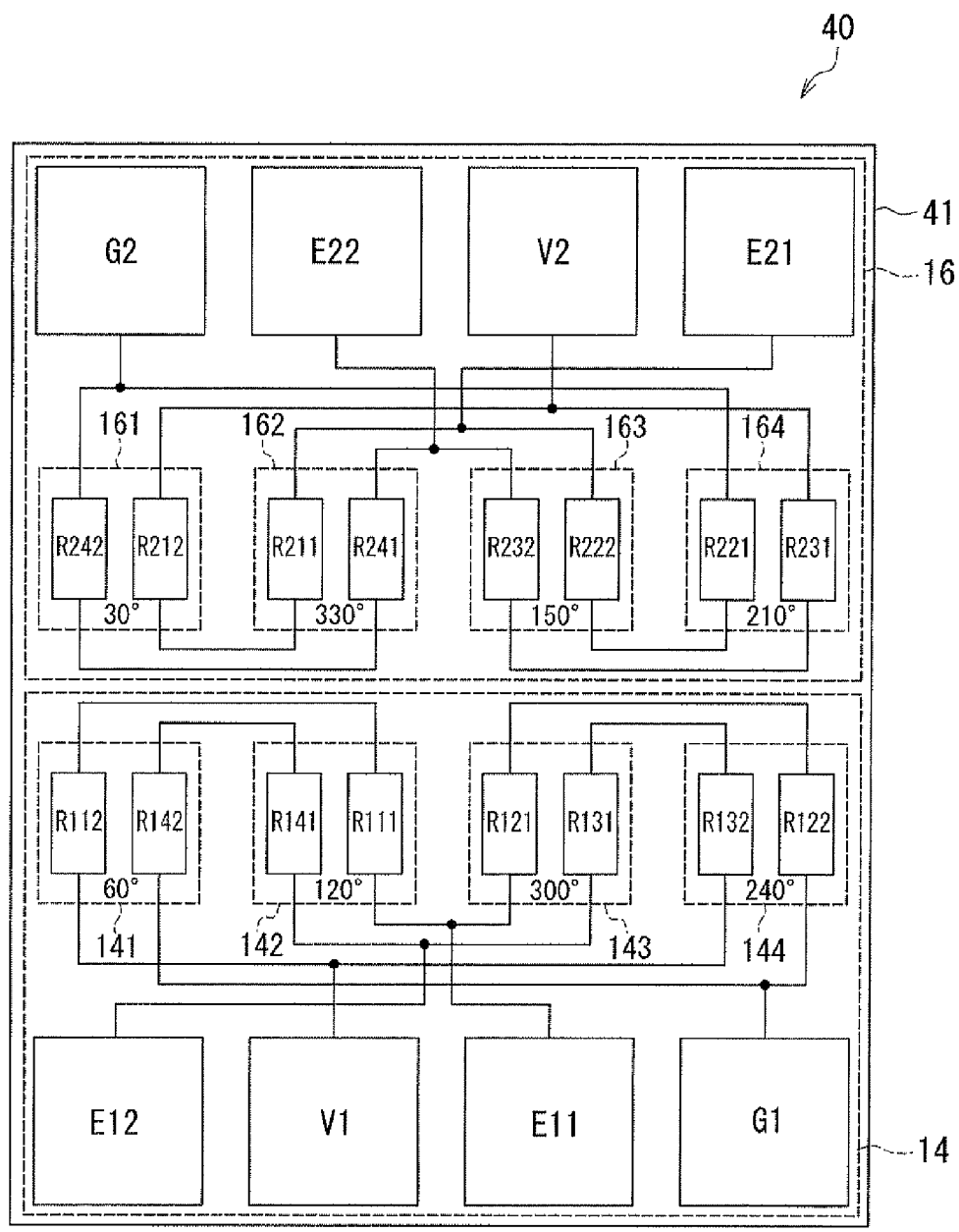
FIG. 19 is a plan view of a unit that incorporates four bridge circuits of a rotating field sensor according to a second embodiment of the invention.

FIG. 19 is a plan view of a unit 40 that incorporates the bridge circuits 14 and 16 shown in FIG. 3. The unit 40 includes a substrate 41 with the bridge circuits 14 and 16 provided thereon. The bridge circuit 14 is located on the lower side in FIG. 19. The bridge circuit 16 is located on the upper side in FIG. 19. The plurality of ports of the bridge circuits 14 and 16 are arranged on the substrate 41, near peripheral edges of the substrate 41.

The bridge circuit 14 has four MR element layout areas 141, 142, 143, and 144. Two MR elements are located in each of the MR element layout areas 141 to 144. In the MR element layout areas 141 and 142, MR elements that are included in the first MR element row R11 and the fourth MR element row R14 respectively and provided with magnetization pinned layers having the same magnetization direction are disposed adjacent to each other. In the MR element layout areas 143 and 144, MR elements that are included in the second MR element row R12 and the third MR element row R13 respectively and provided with magnetization pinned layers having the same magnetization direction are disposed adjacent to each other. Note that the numerical value in each of the MR element layout areas 141 to 144 shows an example of the angle that the magnetization direction of the magnetization pinned layer of the MR element forms with respect to the reference direction DR.

The bridge circuit 16 has four MR element layout areas 161, 162, 163, and 164. Two MR elements are located in each of the MR element layout areas 161 to 164. In the MR element layout areas 161 and 162, MR elements that are included in the first MR element row R21 and the fourth MR element row R24 respectively and provided with magnetization pinned layers having the same magnetization direction are disposed adjacent to each other. In the MR element layout areas 163 and 164, MR elements that are included in the second MR element row R22 and the third MR element row R23 respectively and provided with magnetization pinned layers having the same magnetization direction are disposed adjacent to each other. Note that the numerical value in each of the MR element layout areas 161 to 164 shows an example of the angle that the magnetization direction of the magnetization pinned layer of the MR element forms with respect to the reference direction DR.

In the present embodiment, MR elements with magnetization pinned layers having the same magnetization direction are disposed adjacent to each other in each of the MR element layout areas. The magnetization direction of the magnetization pinned layer in each MR element may be pinned in the following manner, for example. With an external magnetic field applied to the unit 40, one MR element layout area is locally irradiated with a laser beam, whereby the temperature of the two MR elements in the MR element layout area is increased and then decreased. According to the present embodiment, since MR elements with magnetization pinned layers having the same magnetization direction are disposed adjacent to each other, it is possible to pin the magnetization direction of the magnetization pinned layers in two adjacent MR elements simultaneously by irradiating the two adjacent MR elements with a laser beam simultaneously. Accordingly, as compared with a case where MR elements with magnetization pinned layers having different magnetization directions are disposed adjacent to each other, the present embodiment allows a reduction in the number of times of application of the laser beam. This makes it possible to shorten the time required to fabricate the rotating field sensor.

Here, suppose that MR elements with magnetization pinned layers having different magnetization directions are disposed adjacent to each other. In this case, when the MR elements are irradiated with a laser beam to pin the magnetization directions of the magnetization pinned layers, other MR elements around the target MR elements being irradiated could also be subjected to the laser beam or to the heat resulting from the irradiation of the target MR elements with the laser beam. As a result, the MR elements around the target MR elements may become functionally deficient. This becomes prominent particularly when the laser beam irradiation area does not have a high resolution. For this reason, if MR elements with magnetization pinned layers having different magnetization directions are disposed adjacent to each other, it is necessary that the adjacent MR elements be spaced apart from each other by some distance in order to avoid the aforementioned problem. This results in an increase in size of each of the bridge circuits 14 and 16. In contrast to this, according to the present embodiment, MR elements with magnetization pinned layers having the same magnetization direction are disposed adjacent to each other. This arrangement allows the two adjacent MR elements to be simultaneously irradiated with a laser beam. Accordingly, the two adjacent MR elements can be disposed close to each other. The present embodiment thus allows the bridge circuits 14 and 16 to be small in size.

The other configuration, operation, and effects of the present embodiment are the same as those of the first embodiment.

Third Embodiment

Figure 20:
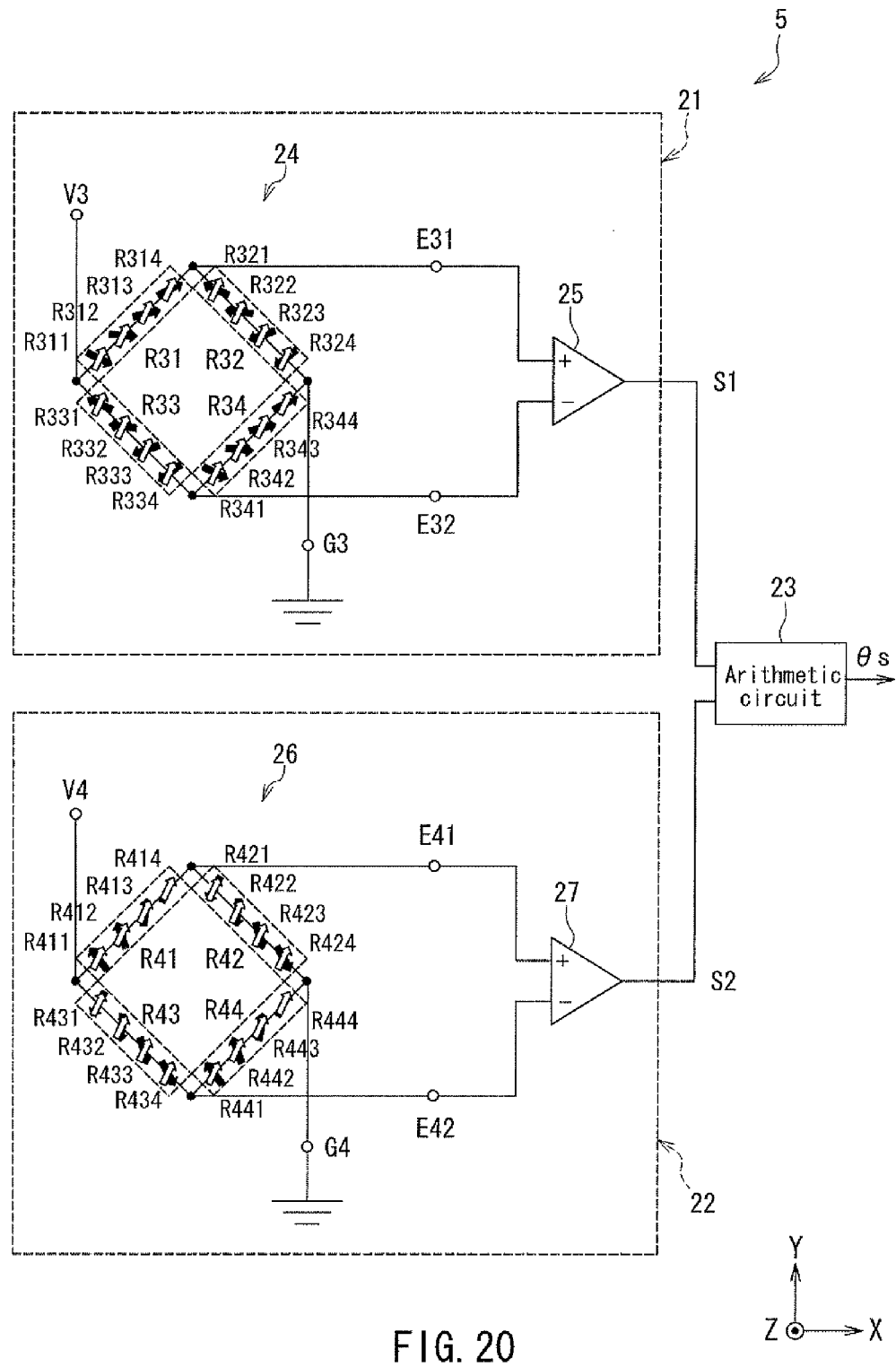
FIG. 20 is a circuit diagram showing the configuration of a rotating field sensor according to a third embodiment of the invention.

A rotating field sensor according to a third embodiment of the invention will now be described with reference to FIG. 20. FIG. 20 is a circuit diagram showing the configuration of the rotating field sensor 5 according to the present embodiment. The rotating field sensor 5 according to the present embodiment has a first detection circuit 21, a second detection circuit 22, and an arithmetic circuit 23, instead of the first detection circuit 11, the second detection circuit 12, and the arithmetic circuit 13 of the first embodiment. The first detection circuit 21 detects the intensity of a component of the rotating magnetic field MF in a first direction D1, and outputs a first signal S1 indicating the intensity. The second detection circuit 22 detects the intensity of a component of the rotating magnetic field MF in a second direction D2, and outputs a second signal S2 indicating the intensity. The arithmetic circuit 23 calculates, based on the first signal S1 and the second signal S2, a detected angle value θs having a correspondence relationship with the angle θ that the direction DM of the rotating magnetic field MF in the reference position PR forms with respect to the reference direction DR. The arithmetic circuit 23 calculates the detected angle value θs by the same method as in the first embodiment. The relationships between the reference direction DR and the first and second directions D1 and D2 are the same as the relationships between the reference direction DR and the first and second directions D1 and D2 shown in FIG. 2.

The configurations of the first and second detection circuits 21 and 22 will now be described in detail. The first detection circuit 21 has a bridge circuit 24 and a difference detector 25. The bridge circuit 24 includes a power supply port V3, a ground port G3, two output ports E31 and E32, first and second MR element rows R31 and R32 connected in series, and third and fourth MR element rows R33 and R34 connected in series. Each of the first to fourth MR element rows R31 to R34 is composed of a plurality of MR elements connected in series. Each of the first to fourth MR element rows R31 to R34 has a first end and a second end.

The first end of the first MR element row R31 and the first end of the third MR element row R13 are connected to the power supply port V3. The second end of the first MR element row R31 is connected to the first end of the second MR element row R32 and the output port E31. The second end of the third MR element row R33 is connected to the first end of the fourth MR element row R34 and the output port E32. The second end of the second MR element row R32 and the second end of the fourth MR element row R34 are connected to the ground port G3. A power supply voltage of predetermined magnitude is applied to the power supply port V3. The ground port G3 is grounded. The difference detector 25 outputs to the arithmetic circuit 23 a signal corresponding to the potential difference between the output ports E31 and E32 as the first signal S1.

In the first detection circuit 21, the magnetization directions of the magnetization pinned layers in the MR elements are pinned so that the potential difference between the output ports E31 and E32 varies according to the intensity of the component of the rotating magnetic field MF in the first direction D1. The first direction D1 therefore serves as a reference direction when the first detection circuit 21 detects the rotating magnetic field MF. The first detection circuit 21 detects the intensity of the component of the rotating magnetic field MF in the first direction D1, and outputs the first signal S1 indicating the intensity. In the example shown in FIG. 20, the magnetization directions of the magnetization pinned layers in the MR elements are pinned so that the potential difference between the output ports E31 and E32 varies according to the intensity of the component of the rotating magnetic field MF in the X direction. In this example, the first direction D1 is the same as the X direction.

The second detection circuit 22 has a bridge circuit 26 and a difference detector 27. The bridge circuit 26 includes a power supply port V4, a ground port G4, two output ports E41 and E42, first and second MR element rows R41 and R42 connected in series, and third and fourth MR element rows R43 and R44 connected in series. Each of the first to fourth MR element rows R41 to R44 is composed of a plurality of MR elements connected in series. Each of the first to fourth MR element rows R41 to R44 has a first end and a second end.

The first end of the first MR element row R41 and the first end of the third MR element row R43 are connected to the power supply port V4. The second end of the first MR element row R41 is connected to the first end of the second MR element row R42 and the output port E41. The second end of the third MR element row R43 is connected to the first end of the fourth MR element row R44 and the output port E42. The second end of the second MR element row R42 and the second end of the fourth MR element row R44 are connected to the ground port G4. A power supply voltage of predetermined magnitude is applied to the power supply port V4. The ground port G4 is grounded. The difference detector 27 outputs to the arithmetic circuit 23 a signal corresponding to the potential difference between the output ports E41 and E42 as the second signal S2.

In the second detection circuit 22, the magnetization directions of the magnetization pinned layers in the MR elements are pinned so that the potential difference between the output ports E41 and E42 varies according to the intensity of the component of the rotating magnetic field MF in the second direction D2. The second direction D2 therefore serves as a reference direction when the second detection circuit 22 detects the rotating magnetic field MF. The second detection circuit 22 detects the intensity of the component of the rotating magnetic field MF in the second direction D2, and outputs the second signal S2 indicating the intensity. In the example shown in FIG. 20, the magnetization directions of the magnetization pinned layers in the MR elements are pinned so that the potential difference between the output ports E41 and E42 varies according to the intensity of the component of the rotating magnetic field MF in the Y direction. In this example, the second direction D2 is the same as the Y direction.

Now, a detailed description will be given of a plurality of MR elements that form each MR element row. First, a plurality of MR elements forming the first to fourth MR element rows R31, R32, R33, and R34 of the bridge circuit 24 will be described. Each of the first to fourth MR element rows R31, R32, R33, and R34 is composed of four MR elements connected in series. The first MR element row R31 is composed of a first pair of MR elements R311 and R312 and a second pair of MR elements R313 and R314. The second MR element row R32 is composed of a first pair of MR elements R321 and R322 and a second pair of MR elements R323 and R324. The third MR element row R33 is composed of a first pair of MR elements R331 and R332 and a second pair of MR elements R333 and R334. The fourth MR element row R34 is composed of a first pair of MR elements R341 and R342 and a second pair of MR elements R343 and R344.

One end of the MR element R311 serves as the first end of the first MR element row R31. The other end of the MR element R311 is connected to one end of the MR element R312. The other end of the MR element R312 is connected to one end of the MR element R313. The other end of the MR element R313 is connected to one end of the MR element R314. The other end of the MR element R314 serves as the second end of the first MR element row R31.

One end of the MR element R321 serves as the first end of the second MR element row R32. The other end of the MR element R321 is connected to one end of the MR element R322. The other end of the MR element R322 is connected to one end of the MR element R323. The other end of the MR element R323 is connected to one end of the MR element R324. The other end of the MR element R324 serves as the second end of the second MR element row R32.

One end of the MR element R331 serves as the first end of the third MR element row R33. The other end of the MR element R331 is connected to one end of the MR element R332. The other end of the MR element R332 is connected to one end of the MR element R333. The other end of the MR element R333 is connected to one end of the MR element R334. The other end of the MR element R334 serves as the second end of the third MR element row R33.

One end of the MR element R341 serves as the first end of the fourth MR element row R34. The other end of the MR element R341 is connected to one end of the MR element R342. The other end of the MR element R342 is connected to one end of the MR element R343. The other end of the MR element R343 is connected to one end of the MR element R344. The other end of the MR element R344 serves as the second end of the fourth MR element row R34.

Note that the MR elements R311, R312, R313, and R314 forming the first MR element row R31 have only to be connected in series between the first and second ends of the first MR element row R31, and may be arranged in any order other than that in the example shown in FIG. 20. Likewise, four MR elements forming each of the other MR element rows have only to be connected in series between the first and second ends of the MR element row, and may be arranged in any order other than that in the example shown in FIG. 20.

Figure 21:
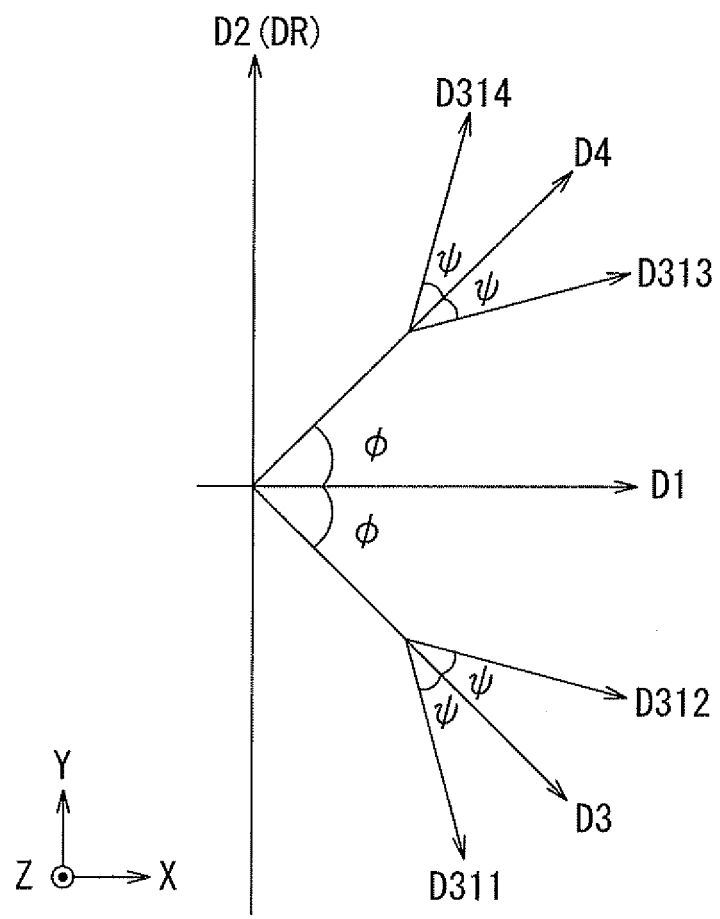
FIG. 21 is an explanatory diagram illustrating the magnetization directions of the magnetization pinned layers in a first and a second pair of MR elements that form an MR element row in the rotating field sensor shown in FIG. 20.

Now, a description will be given of the magnetization directions of the magnetization pinned layers in the MR elements R311 to R314, R321 to R324, R331 to R334, and R341 to R344. FIG. 21 is an explanatory diagram showing the magnetization directions of the magnetization pinned layers in the first pair of MR elements R311 and R312 and the second pair of MR elements R313 and R314 forming the first MR element row R31. In FIG. 21, the arrows with symbols D311, D312, D313, and D314 indicate the magnetization directions of the magnetization pinned layers in the MR elements R111, R112, R313, and R314, respectively. In FIG. 21, the arrow with symbol D3 indicates the intermediate direction between the magnetization directions D311 and D312 of the magnetization pinned layers in the two MR elements R311 and R312 making up the first pair of MR elements in the first MR element row R31. In FIG. 21, the arrow with symbol D4 indicates the intermediate direction between the magnetization directions D313 and D314 of the magnetization pinned layers in the two MR elements R313 and R314 making up the second pair of MR elements in the first MR element row R31. Hereinafter, for the first to fourth MR element rows R31 to R34, the intermediate direction between the magnetization directions of the magnetization pinned layers of two MR elements making up the first pair will be referred to as the third direction, and the intermediate direction between the magnetization directions of the magnetization pinned layers of two MR elements making up the second pair will be referred to as the fourth direction.

As shown in FIG. 21, the magnetization directions D311, D312, D313, and D314 of the magnetization pinned layers in the MR elements R311, R312, R313, and R314 are pinned so that the intermediate direction between the third direction D3 and the fourth direction D4 is the same as the first direction D1 (the X direction). The third direction D3 and the fourth direction D4 form a predetermined relative angle $2\phi$ other than 0° and 180°. The third direction D3 is the direction rotated clockwise from the first direction D1 by an angle $\phi$. The fourth direction D4 is the direction rotated counterclockwise from the first direction D1 by the angle $\phi$. The magnetization directions D311 and D312 of the magnetization pinned layers in the first pair of MR elements R311 and R312 form a predetermined relative angle $2\psi$ other than 0° and 180°. The magnetization directions D313 and D314 of the magnetization pinned layers in the second pair of MR elements R313 and R314 also form a predetermined relative angle $2\psi$ other than 0° and 180°. The magnetization direction D311 of the magnetization pinned layer in the MR element R311 is the direction rotated clockwise from the third direction D3 by an angle $\psi$. The magnetization direction D312 of the magnetization pinned layer in the MR element R312 is the direction rotated counterclockwise from the third direction D3 by the angle $\psi$. The magnetization direction D313 of the magnetization pinned layer in the MR element R313 is the direction rotated clockwise from the fourth direction D4 by the angle $\psi$. The magnetization direction D314 of the magnetization pinned layer in the MR element R314 is the direction rotated counterclockwise from the fourth direction D4 by the angle ψ. The angles φ and ψ are different from each other. The angle φ is 45°, for example. The angle ψ is 30°, for example.

The magnetization directions of the magnetization pinned layers in the MR elements R321 to R324 forming the second MR element row R32 are pinned so that the intermediate direction between the third direction and the fourth direction in the second MR element row R32 is opposite to the first direction D1, i.e., the −X direction. The magnetization directions of the magnetization pinned layers in the MR elements R331 to R334 forming the third MR element row R33 are also pinned so that the intermediate direction between the third direction and the fourth direction in the third MR element row R33 is opposite to the first direction D1. The magnetization directions of the magnetization pinned layers in the MR elements R331, R332, R333, and R334 are the same as those of the magnetization pinned layers in the MR elements R321, R322, R323, and R324, respectively.

The magnetization direction of the magnetization pinned layers in the MR elements R321 and R331 is opposite to the magnetization direction D311 of the magnetization pinned layer in the MR element R311 shown in FIG. 21. The magnetization direction of the magnetization pinned layers in the MR elements R322 and R332 is opposite to the magnetization direction D312 of the magnetization pinned layer in the MR element R312 shown in FIG. 21. The magnetization direction of the magnetization pinned layers in the MR elements R323 and R333 is opposite to the magnetization direction D313 of the magnetization pinned layer in the MR element R313 shown in FIG. 21. The magnetization direction of the magnetization pinned layers in the MR elements R324 and R334 is opposite to the magnetization direction D314 of the magnetization pinned layer in the MR element R314 shown in FIG. 21.

The third direction and the fourth direction in the second MR element row R32 form a relative angle 2φ. The third direction is the direction rotated clockwise by the angle φ from the direction opposite to the first direction D1. The fourth direction is the direction rotated counterclockwise by the angle φ from the direction opposite to the first direction D1. The magnetization directions of the magnetization pinned layers in the MR elements R321 and R322 form a relative angle 2ψ. The magnetization directions of the magnetization pinned layers in the MR elements R323 and R324 also form the relative angle 2ψ. The magnetization direction of the magnetization pinned layer in the MR element R321 is the direction rotated clockwise from the third direction by the angle ψ. The magnetization direction of the magnetization pinned layer in the MR element R322 is the direction rotated counterclockwise from the third direction by the angle ψ. The magnetization direction of the magnetization pinned layer in the MR element R323 is the direction rotated clockwise from the fourth direction by the angle ψ. The magnetization direction of the magnetization pinned layer in the MR element R324 is the direction rotated counterclockwise from the fourth direction by the angle ψ.

The third direction and the fourth direction in the third MR element row R33 are the same as the third direction and the fourth direction in the second MR element row R32, respectively. The magnetization directions of the magnetization pinned layers in the MR elements R331 and R332 form a relative angle 2ψ. The magnetization directions of the magnetization pinned layers in the MR elements R333 and R334 also form the relative angle 2ψ. The magnetization direction of the magnetization pinned layer in the MR element R331 is the direction rotated clockwise from the third direction by the angle ψ. The magnetization direction of the magnetization pinned layer in the MR element R332 is the direction rotated counterclockwise from the third direction by the angle ψ. The magnetization direction of the magnetization pinned layer in the MR element R333 is the direction rotated clockwise from the fourth direction by the angle ψ. The magnetization direction of the magnetization pinned layer in the MR element R334 is the direction rotated counterclockwise from the fourth direction by the angle ψ.

The magnetization directions of the magnetization pinned layers in the MR elements R341 to R344 forming the fourth MR element row R34 are pinned so that the intermediate direction between the third direction and the fourth direction in the fourth MR element row R34 is the same as the first direction D1 (the X direction). The magnetization directions of the magnetization pinned layers in the MR elements R341, R342, R343, and R344 are the same as those of the magnetization pinned layers in the MR elements R311, R312, R313, and R314, respectively.

The third direction and the fourth direction in the fourth MR element row R34 are the same as the third direction and the fourth direction in the first MR element row R31, respectively. The magnetization directions of the magnetization pinned layers in the MR elements R341 and R342 form a relative angle 2ψ. The magnetization directions of the magnetization pinned layers in the MR elements R343 and R344 also form the relative angle 2ψ. The magnetization direction of the magnetization pinned layer in the MR element R341 is the direction rotated clockwise from the third direction by the angle ψ. The magnetization direction of the magnetization pinned layer in the MR element R342 is the direction rotated counterclockwise from the third direction by the angle ψ. The magnetization direction of the magnetization pinned layer in the MR element R343 is the direction rotated clockwise from the fourth direction by the angle ψ. The magnetization direction of the magnetization pinned layer in the MR element R344 is the direction rotated counterclockwise from the fourth direction by the angle ψ.

Now, a description will be given of MR elements that form the first to fourth MR element rows R41, R42, R43, and R44 of the bridge circuit 26. Each of the first to fourth MR element rows R41, R42, R43, and R44 is composed of four MR elements connected in series. The first MR element row R41 is composed of a third pair of MR elements R411 and R412 and a fourth pair of MR elements R413 and R414. The second MR element row R42 is composed of a third pair of MR elements R421 and R422 and a fourth pair of MR elements R423 and R424. The third MR element row R43 is composed of a third pair of MR elements R431 and R432 and a fourth pair of MR elements R433 and R434. The fourth MR element row R44 is composed of a third pair of MR elements R441 and R442 and a fourth pair of MR elements R443 and R444.

One end of the MR element R411 serves as the first end of the first MR element row R41. The other end of the MR element R411 is connected to one end of the MR element R412. The other end of the MR element R412 is connected to one end of the MR element R413. The other end of the MR element R413 is connected to one end of the MR element R414. The other end of the MR element R414 serves as the second end of the first MR element row R41.

One end of the MR element R421 serves as the first end of the second MR element row R42. The other end of the MR element R421 is connected to one end of the MR element R422. The other end of the MR element R422 is connected to one end of the MR element R423. The other end of the MR element R423 is connected to one end of the MR element R424. The other end of the MR element R424 serves as the second end of the second MR element row R42.

One end of the MR element R431 serves as the first end of the third MR element row R43. The other end of the MR element R431 is connected to one end of the MR element R432. The other end of the MR element R432 is connected to one end of the MR element R433. The other end of the MR element R433 is connected to one end of the MR element R434. The other end of the MR element R434 serves as the second end of the third MR element row R43.

One end of the MR element R441 serves as the first end of the fourth MR element row R44. The other end of the MR element R441 is connected to one end of the MR element R442. The other end of the MR element R442 is connected to one end of the MR element R443. The other end of the MR element R443 is connected to one end of the MR element R444. The other end of the MR element R444 serves as the second end of the fourth MR element row R44.

Note that the MR elements R411, R412, R413, and R414 forming the first MR element row R41 have only to be connected in series between the first and second ends of the first MR element row R41, and may be arranged in any order other than that in the example shown in FIG. 20. Likewise, four MR elements forming each of the other MR element rows have only to be connected in series between the first and second ends of the MR element row, and may be arranged in any order other than that in the example shown in FIG. 20.

Now, a description will be given of the magnetization directions of the magnetization pinned layers in the MR elements R411 to R414, R421 to R424, R431 to R434, and R441 to R444. For the first to fourth MR element rows R41 to R44, the intermediate direction between the magnetization directions of the magnetization pinned layers of two MR elements making up the third pair will be referred to as the fifth direction, and the intermediate direction between the magnetization directions of the magnetization pinned layers of two MR elements making up the fourth pair will be referred to as the sixth direction. The magnetization directions of the magnetization pinned layers in the MR elements R411 to R414 forming the first MR element row R41 are pinned so that the intermediate direction between the fifth direction and the sixth direction in the first MR element row R41 is the same as the second direction D2 (the Y direction). The magnetization directions of the magnetization pinned layers in the MR elements R441 to R444 forming the fourth MR element row R44 are also pinned so that the intermediate direction between the fifth direction and the sixth direction in the fourth MR element row R44 is the same as the second direction D2. The magnetization directions of the magnetization pinned layers in the MR elements R441, R442, R443, and R444 are the same as those of the magnetization pinned layers in the MR elements R411, R412, R413, and R414, respectively.

The magnetization direction of the magnetization pinned layers in the MR elements R411 and R441 is the direction rotated counterclockwise by 90° from the magnetization direction D314 of the magnetization pinned layer in the MR element R314 shown in FIG. 21. The magnetization direction of the magnetization pinned layers in the MR elements R412 and R442 is the direction rotated counterclockwise by 90° from the magnetization direction D313 of the magnetization pinned layer in the MR element R313 shown in FIG. 21. The magnetization direction of the magnetization pinned layers in the MR elements R413 and R443 is the direction rotated counterclockwise by 90° from the magnetization direction D312 of the magnetization pinned layer in the MR element R312 shown in FIG. 21. The magnetization direction of the magnetization pinned layers in the MR elements R414 and R444 is the direction rotated counterclockwise by 90° from the magnetization direction D311 of the magnetization pinned layer in the MR element R311 shown in FIG. 21.

The fifth direction and the sixth direction in the first MR element row R41 form a relative angle $2\phi$. The fifth direction is the direction rotated counterclockwise from the second direction D2 by the angle $\phi$. The sixth direction is the direction rotated clockwise from the second direction D2 by the angle $\phi$. The magnetization directions of the magnetization pinned layers in the MR elements R411 and R412 form a relative angle $2\psi$. The magnetization directions of the magnetization pinned layers in the MR elements R413 and R414 also form the relative angle $2\psi$. The magnetization direction of the magnetization pinned layer in the MR element R411 is the direction rotated counterclockwise from the fifth direction by the angle $\psi$. The magnetization direction of the magnetization pinned layer in the MR element R412 is the direction rotated clockwise from the fifth direction by the angle $\psi$. The magnetization direction of the magnetization pinned layer in the MR element R413 is the direction rotated counterclockwise from the sixth direction by the angle $\psi$. The magnetization direction of the magnetization pinned layer in the MR element R414 is the direction rotated clockwise from the sixth direction by the angle $\psi$.

The fifth direction and the sixth direction in the fourth MR element row R44 are the same as the fifth direction and the sixth direction in the first MR element row R41, respectively. The magnetization directions of the magnetization pinned layers in the MR elements 11441 and R442 form a relative angle $2\psi$. The magnetization directions of the magnetization pinned layers in the MR elements 11443 and R444 also form the relative angle $2\psi$. The magnetization direction of the magnetization pinned layer in the MR element R441 is the direction rotated counterclockwise from the fifth direction by the angle $\psi$. The magnetization direction of the magnetization pinned layer in the MR element R442 is the direction rotated clockwise from the fifth direction by the angle $\psi$. The magnetization direction of the magnetization pinned layer in the MR element R443 is the direction rotated counterclockwise from the sixth direction by the angle $\psi$. The magnetization direction of the magnetization pinned layer in the MR element R444 is the direction rotated clockwise from the sixth direction by the angle $\psi$.

The magnetization directions of the magnetization pinned layers in the MR elements R421 to R424 forming the second MR element row R42 are pinned so that the intermediate direction between the fifth direction and the sixth direction in the second MR element row R42 is opposite to the second direction D2, i.e., the −Y direction. The magnetization directions of the magnetization pinned layers in the MR elements R431 to R434 forming the third MR element row R43 are also pinned so that the intermediate direction between the fifth direction and the sixth direction in the third MR element row R43 is opposite to the second direction D2. The magnetization directions of the magnetization pinned layers in the MR elements R431, R432, R433, and R434 are the same as those of the magnetization pinned layers in the MR elements R421, R422, R423, and R424, respectively.

The magnetization direction of the magnetization pinned layers in the MR elements R421 and R431 is opposite to the magnetization direction of the magnetization pinned layers in the MR elements R414 and R444. The magnetization direction of the magnetization pinned layers in the MR elements R422 and R432 is opposite to the magnetization direction of the magnetization pinned layers in the MR elements R413 and R443. The magnetization direction of the magnetization pinned layers in the MR elements R423 and R433 is opposite to the magnetization direction of the magnetization pinned layers in the MR elements R412 and R442. The magnetization direction of the magnetization pinned layers in the MR elements R424 and R434 is opposite to the magnetization direction of the magnetization pinned layers in the MR elements R411 and R441.

The fifth direction and the sixth direction in the second MR element row R42 form a relative angle $2\phi$. The fifth direction is the direction rotated clockwise by the angle $\phi$ from the direction opposite to the second direction D2. The sixth direction is the direction rotated counterclockwise by the angle $\phi$ from the direction opposite to the second direction D2. The magnetization directions of the magnetization pinned layers in the MR elements R421 and R422 form a relative angle $2\psi$. The magnetization directions of the magnetization pinned layers in the MR elements R423 and R424 also form the relative angle $2\psi$. The magnetization direction of the magnetization pinned layer in the MR element R421 is the direction rotated clockwise from the fifth direction by the angle $\psi$. The magnetization direction of the magnetization pinned layer in the MR element R422 is the direction rotated counterclockwise from the fifth direction by the angle $\psi$. The magnetization direction of the magnetization pinned layer in the MR element R423 is the direction rotated clockwise from the sixth direction by the angle $\psi$. The magnetization direction of the magnetization pinned layer in the MR element R424 is the direction rotated counterclockwise from the sixth direction by the angle $\psi$.

The fifth direction and the sixth direction in the third MR element row R43 are the same as the fifth direction and the sixth direction in the second MR element row R42, respectively. The magnetization directions of the magnetization pinned layers in the MR elements R431 and R432 form a relative angle $2\psi$. The magnetization directions of the magnetization pinned layers in the MR elements R433 and R434 also form the relative angle $2\psi$. The magnetization direction of the magnetization pinned layer in the MR element R431 is the direction rotated clockwise from the fifth direction by the angle $\psi$. The magnetization direction of the magnetization pinned layer in the MR element R432 is the direction rotated counterclockwise from the fifth direction by the angle $\psi$. The magnetization direction of the magnetization pinned layer in the MR element R433 is the direction rotated clockwise from the sixth direction by the angle $\psi$. The magnetization direction of the magnetization pinned layer in the MR element R434 is the direction rotated counterclockwise from the sixth direction by the angle $\psi$.

As has been described, each MR element row in the first and the second detection circuits 21 and 22 is composed of a plurality of MR elements each having a magnetization pinned layer whose magnetization direction is pinned in a predetermined direction. None of the first to fourth MR element rows R31, R32, R33, and R34 in the first detection circuit 21 includes any MR element that has a magnetization pinned layer whose magnetization direction is pinned in the first direction D1 (the X direction) or in the direction opposite to the first direction D1 (the −X direction). None of the first to fourth MR element rows R41, R42, R43, and R44 in the second detection circuit 22 includes any MR element that has a magnetization pinned layer whose magnetization direction is pinned in the second direction D2 (the Y direction) or in the direction opposite to the second direction D2 (the −Y direction).

Now, a description will be given of a specific example of magnetization directions of the magnetization pinned layers of MR elements. First, the following description will deal with a plurality of MR elements forming each MR element row in the first detection circuit 21. The magnetization direction of the magnetization pinned layer of each MR element can be expressed using the angle that the magnetization direction forms with respect to the reference direction DR. Likewise, the third direction and the fourth direction in the first to fourth MR element rows R31 to R34 can also be expressed using the angles that the third direction and the fourth direction form with respect to the reference direction DR. Here, the angle that the intermediate direction between the third and fourth directions forms with respect to the reference direction DR will be referred to as the angle of the first type. The angle that the third or fourth direction forms with respect to the reference direction DR will be referred to as the angle of the second type. The angle that the magnetization direction of the magnetization pinned layer of each MR element included in the first detection circuit 21 forms with respect to the reference direction DR will be referred to as the angle of the third type. The angle $\phi$ shown in FIG. 21 shall be 45°, and the angle $\psi$ shown in FIG. 21 shall be 30°.

Figure 22:
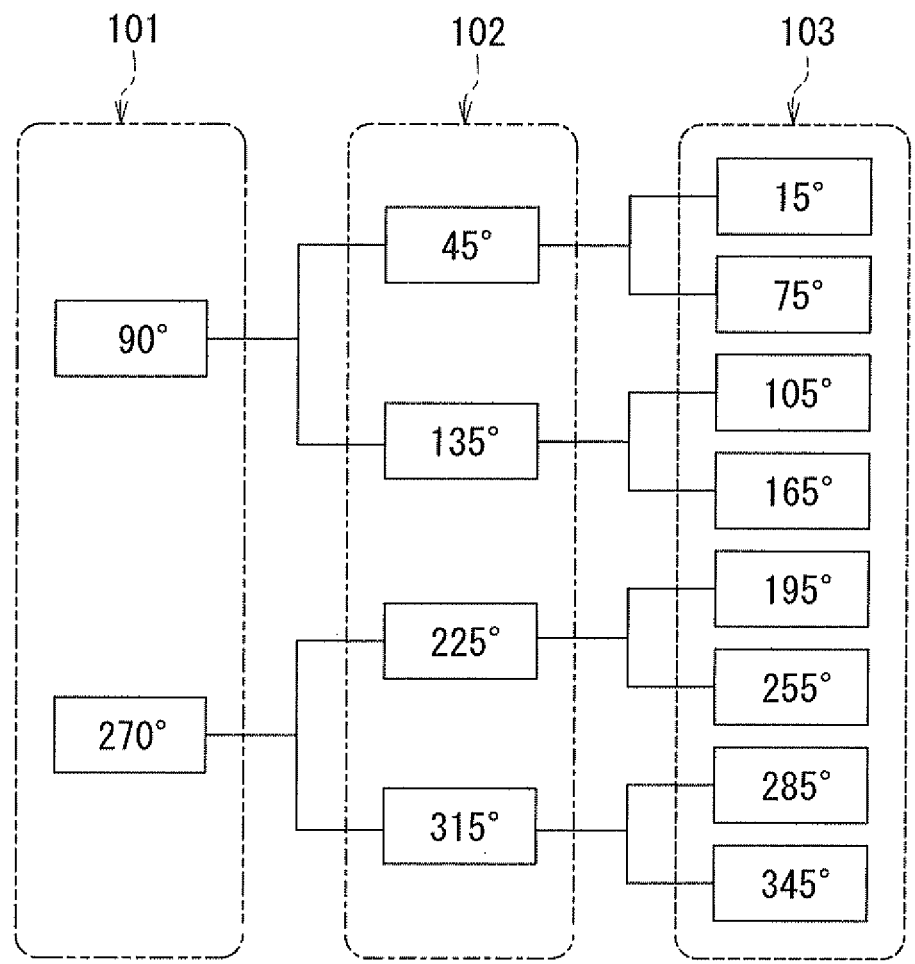
FIG. 22 is an explanatory diagram illustrating the relationship between the angles of first to third types in the first detection circuit of the third embodiment of the invention.

FIG. 22 is an explanatory diagram illustrating the relationship between the angles of the first to third types in the first detection circuit 21. In FIG. 22, each numerical value in the box denoted by reference numeral 101 indicates the angle of the first type, each numerical value in the box denoted by reference numeral 102 indicates the angle of the second type, and each numerical value in the box denoted by reference numeral 103 indicates the angle of the third type. In the present embodiment, the first direction D1 is the direction rotated by 90° from the reference direction DR. Accordingly, the angle of the first type takes on 90° and 270°. The angle of the second type corresponding to the angle 90° of the first type is 45° and 135°. The angle of the second type corresponding to the angle 270° of the first type is 225° and 315°. The angle of the third type corresponding to the angle 45° of the second type is 15° and 75°. The angle of the third type corresponding to the angle 135° of the second type is 105° and 165°. The angle of the third type corresponding to the angle 225° of the second type is 195° and 255°. The angle of the third type corresponding to the angle 315° of the second type is 285° and 345°.

The ideal component of the resistance of a pair of MR elements that have magnetization pinned layers whose magnetization directions are 15° and 75° has the same phase as that of the ideal component of the resistance of a virtual MR element that has a magnetization pinned layer whose magnetization direction is intermediate between 15° and 75°, i.e., 45°. The same holds true for the ideal component of the resistance of other pairs of MR elements. Furthermore, the ideal component of the resistance of each of the MR element rows R31 and R34 composed of four MR elements that have magnetization pinned layers whose magnetization directions are 15°, 75°, 105°, and 165° has the same phase as that of the ideal component of the resistance of a virtual MR element that has a magnetization pinned layer whose magnetization direction is 90°. Likewise, the ideal component of the resistance of each of the MR element rows R32 and R33 composed of four MR elements that have magnetization pinned layers whose magnetization directions are 195°, 255°, 285°, and 345° has the same phase as that of the ideal component of the resistance of a virtual MR element that has a magnetization pinned layer whose magnetization direction is 270°. Consequently, according to the present embodiment, the first detection circuit 21 is able to detect the intensity of the component of the rotating magnetic field MF in the first direction D1 and to output the first signal S1 indicating the intensity even if the first detection circuit 21 does not include any MR element that has a magnetization pinned layer whose magnetization direction is pinned in the first direction D1 or in the direction opposite to the first direction D1.

Next, the following description will deal with a plurality of MR elements forming each MR element row in the second detection circuit 22. Like the third and fourth directions, the fifth direction and the sixth direction in the first to fourth MR element rows R41 to R44 can be expressed using the angles that the fifth direction and the sixth direction form with respect to the reference direction DR. Here, as with the third and fourth directions, the angle that the intermediate direction between the fifth and sixth directions forms with respect to the reference direction DR will be referred to as the angle of the first type, and the angle that the fifth or sixth direction forms with respect to the reference direction DR will be referred to as the angle of the second type. Furthermore, the angle that the magnetization direction of the magnetization pinned layer of each MR element included in the second detection circuit 22 forms with respect to the reference direction DR will be referred to as the angle of the third type.

Figure 23:
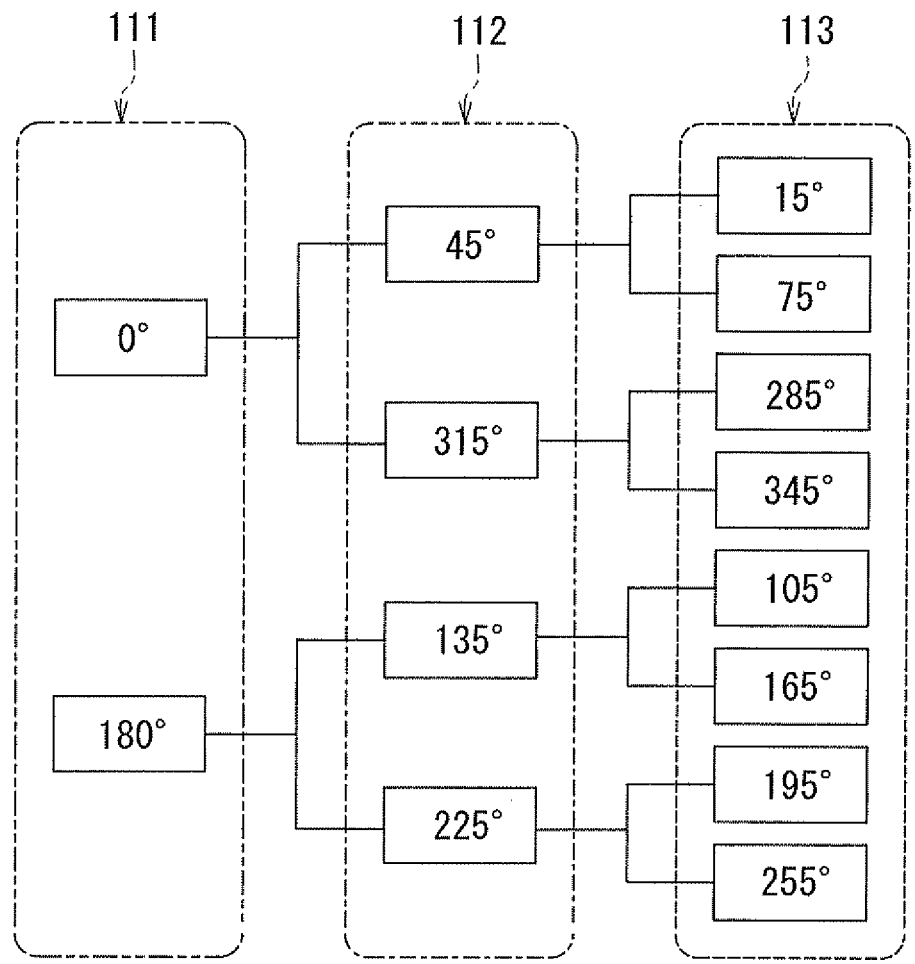
FIG. 23 is an explanatory diagram illustrating the relationship between the angles of first to third types in the second detection circuit of the third embodiment of the invention.

FIG. 23 is an explanatory diagram illustrating the relationship between the angles of the first to third types in the second detection circuit 22. In FIG. 23, each numerical value in the box denoted by reference numeral 111 indicates the angle of the first type, each numerical value in the box denoted by reference numeral 112 indicates the angle of the second type, and each numerical value in the box denoted by reference numeral 113 indicates the angle of the third type. In the present embodiment, the second direction D2 coincides with the reference direction DR. Accordingly, the angle of the first type takes on 0° and 180°. The angle of the second type corresponding to the angle 0° of the first type is 45° and 315°. The angle of the second type corresponding to the angle 180° of the first type is 135° and 225°. The angle of the third type corresponding to the angle 45° of the second type is 15° and 75°. The angle of the third type corresponding to the angle 315° of the second type is 285° and 345°. The angle of the third type corresponding to the angle 135° of the second type is 105° and 165°. The angle of the third type corresponding to the angle 225° of the second type is 195° and 255°.

Like the first detection circuit 21, the second detection circuit 22 is able to detect the intensity of the component of the rotating magnetic field MF in the second direction D2 and to output the second signal S2 indicating the intensity even if the second detection circuit 22 does not include any MR element that has a magnetization pinned layer whose magnetization direction is pinned in the second direction D2 or in the direction opposite to the second direction D2.

The arrangement of a plurality of MR elements in the present embodiment will now be described. Like the second embodiment, the present embodiment is configured so that MR elements that are included in two different MR element rows and provided with magnetization pinned layers having the same magnetization direction are disposed adjacent to each other. More specifically, in the first detection circuit 21, MR elements that are included in the first MR element row R31 and the fourth MR element row R34 respectively and provided with magnetization pinned layers having the same magnetization direction are disposed adjacent to each other, while MR elements that are included in the second MR element row R32 and the third MR element row R33 respectively and provided with magnetization pinned layers having the same magnetization direction are disposed adjacent to each other. In the second detection circuit 22, MR elements that are included in the first MR element row R41 and the fourth MR element row R44 respectively and provided with magnetization pinned layers having the same magnetization direction are disposed adjacent to each other, while MR elements that are included in the second MR element row R42 and the third MR element row R43 respectively and provided with magnetization pinned layers having the same magnetization direction are disposed adjacent to each other.

Figure 24:
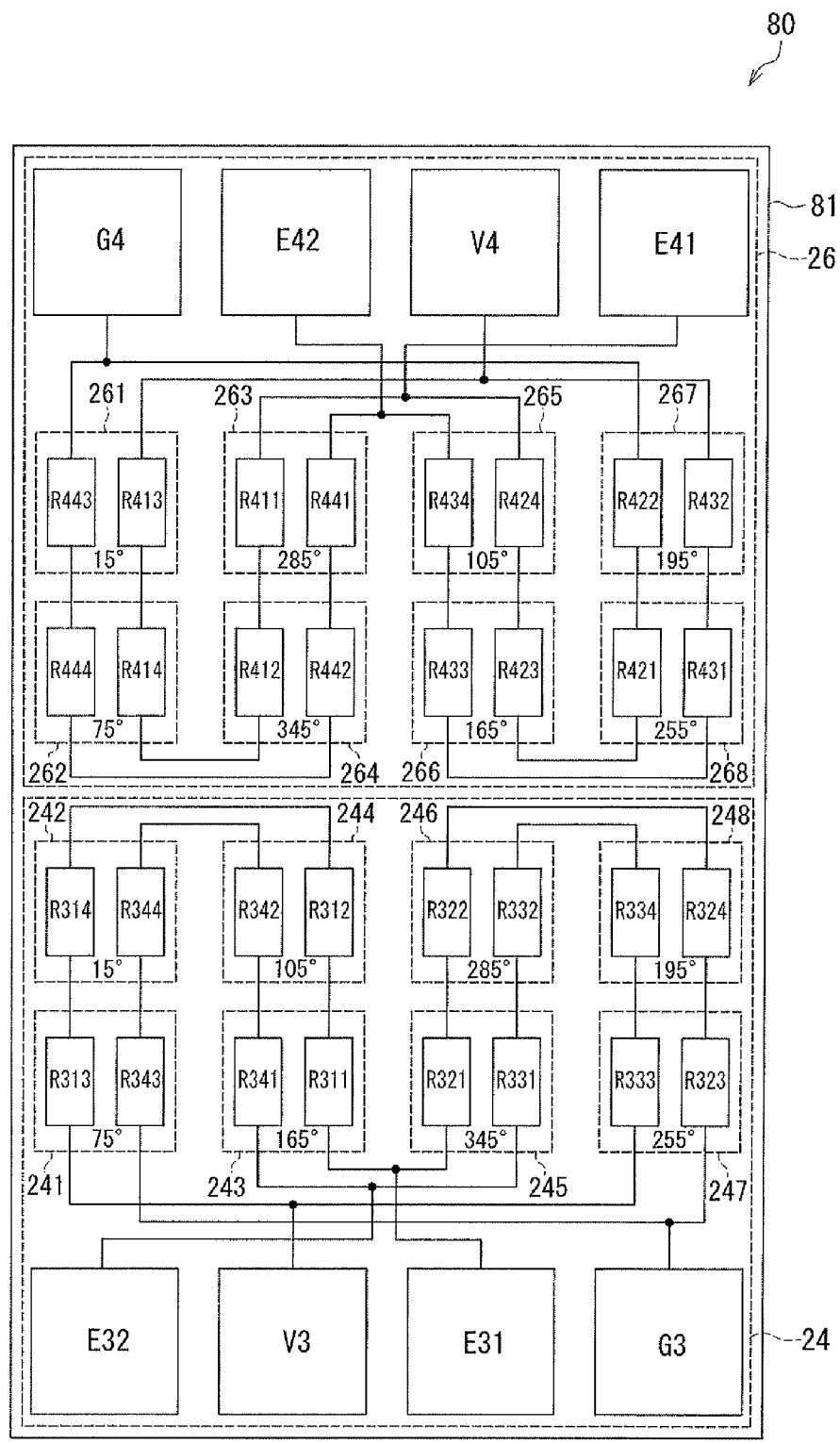
FIG. 24 is a plan view of a unit that incorporates the four bridge circuits of the rotating field sensor according to the third embodiment of the invention.

FIG. 24 is a plan view of a unit 80 that incorporates the bridge circuits 24 and 26 shown in FIG. 20. The unit 80 includes a substrate 81, with the bridge circuits 24 and 26 provided thereon. The bridge circuit 24 is located on the lower side in FIG. 24. The bridge circuit 26 is located on the upper side in FIG. 24. The plurality of ports of the bridge circuits 24 and 26 are arranged on the substrate 81, near peripheral edges of the substrate 81.

The bridge circuit 24 has eight MR element layout areas 241, 242, 243, 244, 245, 246, 247, and 248. Two MR elements are located in each of the MR elements layout areas 241 to 248. In the MR element layout areas 241 to 244, MR elements that are included in the first MR element row R31 and the fourth MR element row R34 respectively and provided with magnetization pinned layers having the same magnetization direction are disposed adjacent to each other. In the MR element layout areas 245 to 248, MR elements that are included in the second MR element row R32 and the third MR element row R33 respectively and provided with magnetization pinned layers having the same magnetization direction are disposed adjacent to each other. Note that the numerical value in each of the MR element layout areas 241 to 248 indicates an example of the angle of the third type shown in FIG. 22, that is, the angle that the magnetization direction of the magnetization pinned layer of the MR element forms with respect to the reference direction DR.

The bridge circuit 26 has eight MR element layout areas 261, 262, 263, 264, 265, 266, 267, and 268. Two MR elements are located in each of the MR elements layout areas 261 to 268. In the MR element layout areas 261 to 264, MR elements that are included in the first MR element row R41 and the fourth MR element row R44 respectively and provided with magnetization pinned layers having the same magnetization direction are disposed adjacent to each other. In the MR element layout areas 265 to 268, MR elements that are included in the second MR element row R42 and the third MR element row R43 respectively and provided with magnetization pinned layers having the same magnetization direction are disposed adjacent to each other. Note that the numerical value in each of the MR element layout areas 261 to 268 indicates an example of the angle of the third type shown in FIG. 23, that is, the angle that the magnetization direction of the magnetization pinned layer of the MR element forms with respect to the reference direction DR.

In the present embodiment, as in the second embodiment, the magnetization direction of the magnetization pinned layer in each MR element may be pinned in the following manner, for example. With an external magnetic field applied to the unit 80, one MR element layout area is locally irradiated with a laser beam, whereby the temperature of the two MR elements in the MR element layout area is increased and then decreased.

The operation and effects of the rotating field sensor 5 will now be described with reference to FIG. 25 to FIG. 33. The following description is made taking the second MR element row R32 of the first detection circuit 21 as an example, with comparison made with virtual MR elements and a virtual MR element row. First, the virtual MR element row and first to third virtual MR elements will be described. The first virtual MR element is configured so that the magnetization pinned layers in the four MR elements R321, R322, R323, and R324 forming the second MR element row R32 have the same magnetization direction. The second virtual MR element is configured so that the magnetization pinned layers in the second pair of MR elements R323 and R324 have the same magnetization direction. The third virtual MR element is configured so that the magnetization pinned layers in the first pair of MR elements R321 and R322 have the same magnetization direction.

The virtual MR element row is composed of the second and third virtual MR elements connected in series. The virtual MR element row has a first end and a second end, as does the second MR element row R32. One end of the second virtual MR element serves as the first end of the virtual MR element row. The other end of the second virtual MR element is connected to one end of the third virtual MR element. The other end of the third virtual MR element serves as the second end of the virtual MR element row.

The magnetization direction of the magnetization pinned layer in the first virtual MR element is opposite to the first direction D1. The intermediate direction between the magnetization directions of the magnetization pinned layers in the second and third virtual MR elements is also opposite to the first direction D1. The magnetization direction of the magnetization pinned layer in the second virtual MR element is the direction rotated counterclockwise by 45° from the direction opposite to the first direction D1. The magnetization direction of the magnetization pinned layer in the third virtual MR element is the direction rotated clockwise by 45° from the direction opposite to the first direction D1.

Figure 31:
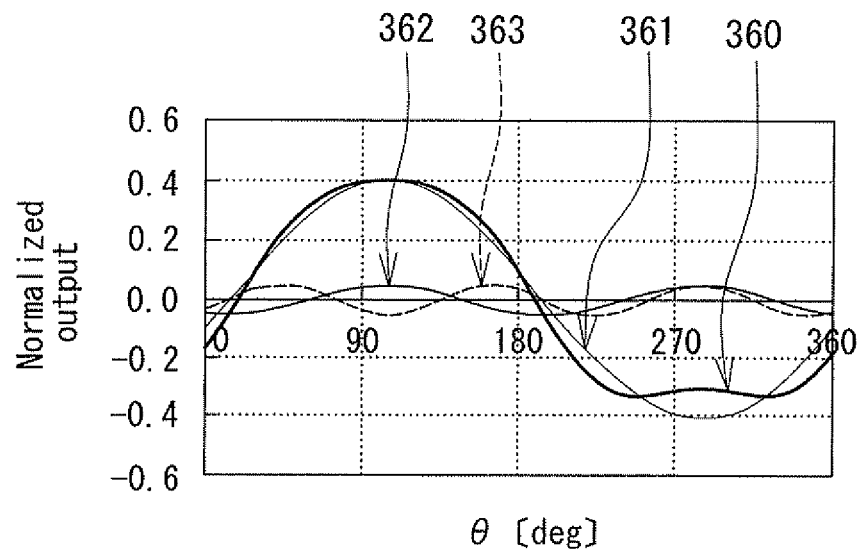
FIG. 31 is a waveform chart showing the waveform of a periodically varying component of the potential difference across one of two MR elements making up a second pair in the third embodiment of the invention.
Figure 32:
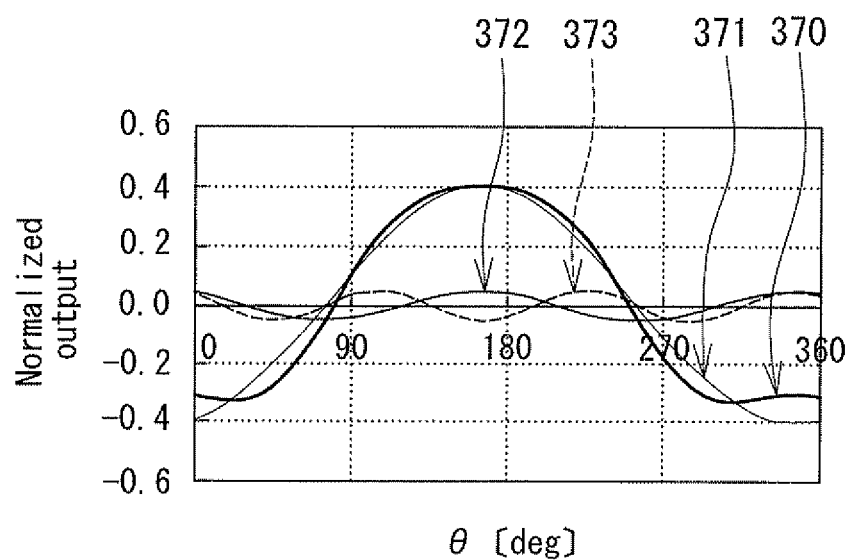
FIG. 32 is a waveform chart showing the waveform of a periodically varying component of the potential difference across the other of the two MR elements making up the second pair in the third embodiment of the invention.
Figure 33:
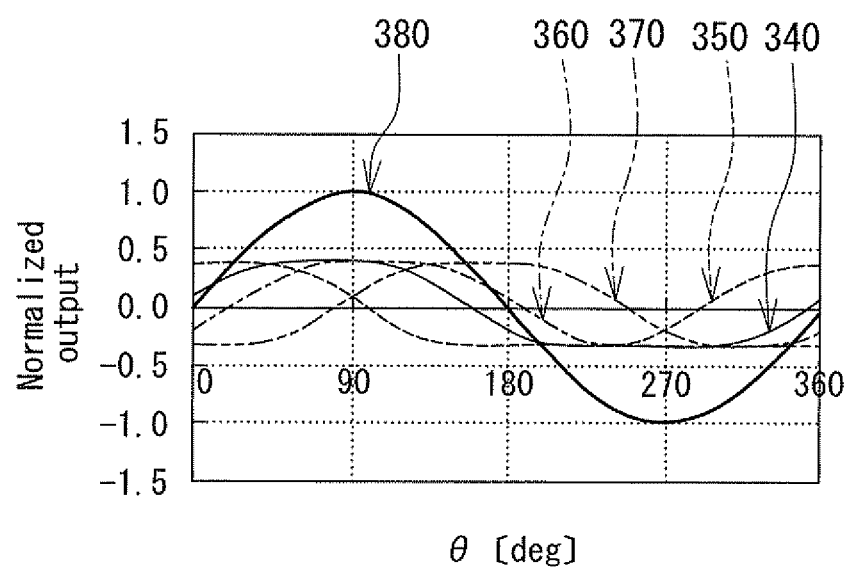
FIG. 33 is a waveform chart showing the waveform of a periodically varying component of the potential difference between a first end and a second end of an MR element row of the third embodiment of the invention.

Each of FIG. 25 to FIG. 33 shows the waveform of the periodically varying component of the potential difference across an MR element or the potential difference between the first and second ends of the MR element row. In FIG. 25 to FIG. 33, the horizontal axis represents the angle θ, while the vertical axis represents the normalized output. The normalized output on the vertical axis indicates the values of the potential difference where the maximum value of the periodically varying component of the potential difference between the first and second ends of the second MR element row R32 shown in FIG. 33 is assumed as 1. The waveforms shown in FIG. 25 to FIG. 33 were generated by simulation.

Figure 25:
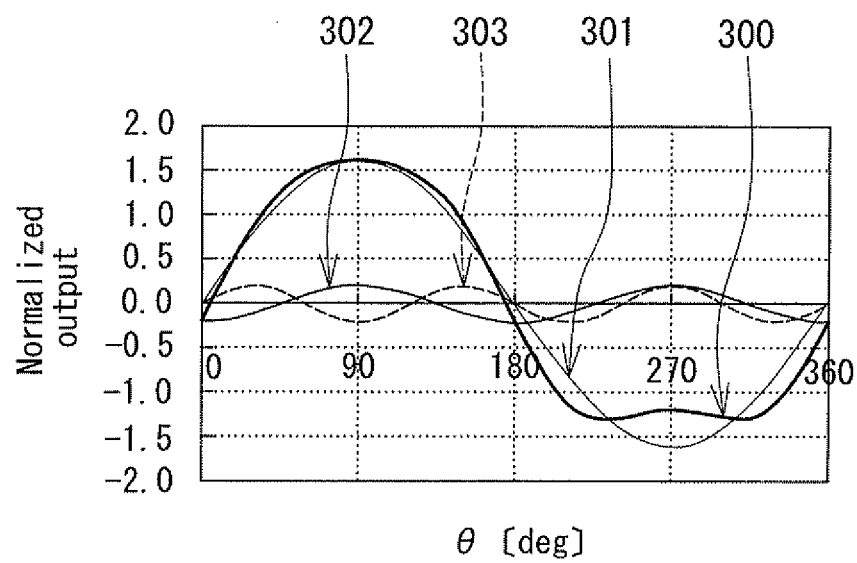
FIG. 25 is a waveform chart showing the waveform of a periodically varying component of the potential difference across a first virtual MR element.

FIG. 25 is a waveform chart showing the waveform of the periodically varying component of the potential difference across the first virtual MR element. Reference numeral 300 indicates the waveform of the periodically varying component of the potential difference. Reference numeral 301 indicates an ideal sinusoidal curve. Reference numeral 302 indicates the waveform of the second potential difference harmonic component that results from the second harmonic component included in the resistance harmonic component of the MR element. Reference numeral 303 indicates the waveform of the third potential difference harmonic component that results from the third harmonic component included in the resistance harmonic component of the MR element. As shown in FIG. 25, the waveform of the periodically varying component of the potential difference shown by reference numeral 300 is distorted from the sinusoidal curve because it includes the second and third potential difference harmonic components.

Figure 26:
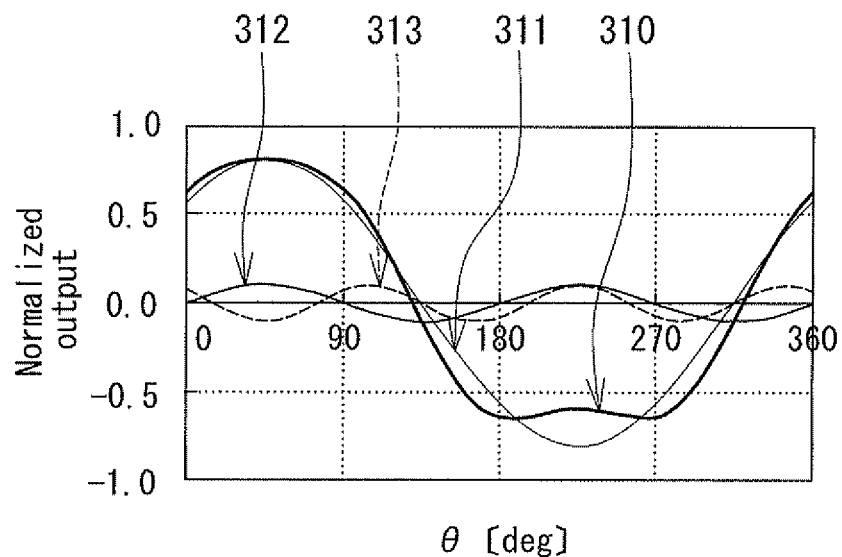
FIG. 26 is a waveform chart showing the waveform of a periodically varying component of the potential difference across a second virtual MR element.
Figure 27:
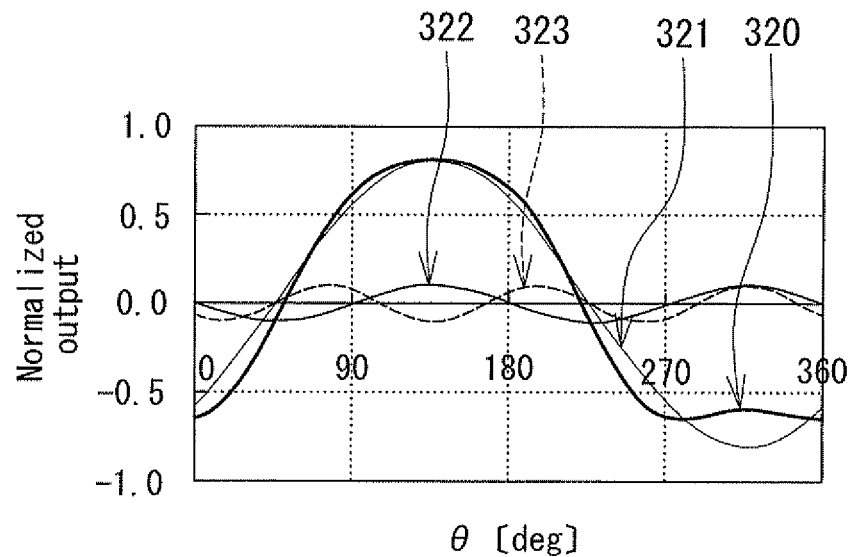
FIG. 27 is a waveform chart showing the waveform of a periodically varying component of the potential difference across a third virtual MR element.

FIG. 26 shows the waveform of the periodically varying component of the potential difference across the second virtual MR element. FIG. 27 shows the waveform of the periodically varying component of the potential difference across the third virtual MR element. Reference numerals 310 and 320 in FIG. 26 and FIG. 27 indicate the waveforms of the periodically varying components of the respective potential differences. Reference numerals 311 and 321 each indicate an ideal sinusoidal curve. Reference numerals 312 and 322 indicate the waveforms of the second potential difference harmonic components that result from the second harmonic components included in the respective resistance harmonic components of the MR elements. Reference numerals 313 and 323 indicate the waveforms of the third potential difference harmonic components that result from the third harmonic components included in the respective resistance harmonic components of the MR elements. The waveforms shown in FIG. 26 differ from the waveforms shown in FIG. 25 in phase by $\pi/4$ (45°). The waveforms shown in FIG. 27 differ from the waveforms shown in FIG. 25 in phase by $-\pi/4$ (−45°).

Figure 28:
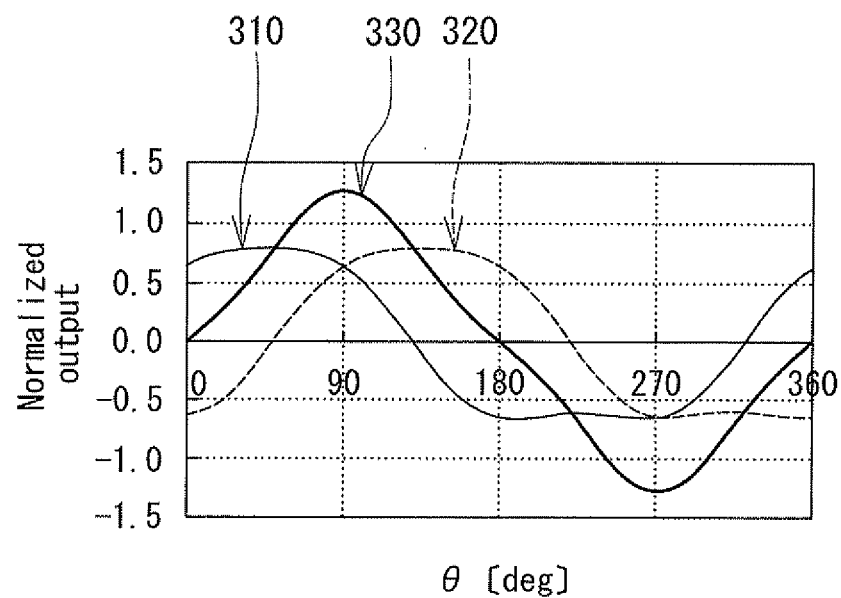
FIG. 28 is a waveform chart showing the waveform of a periodically varying component of the potential difference between a first end and a second end of a virtual MR element row.

FIG. 28 shows the waveform (reference numeral 330) of the periodically varying component of the potential difference between the first end and the second end of the virtual MR element row. FIG. 28 also shows the waveforms (reference numerals 310 and 320) of the periodically varying components of the potential differences shown in FIG. 27 and FIG. 28. As shown in FIG. 26 and FIG. 27, the second potential difference harmonic components denoted by reference numerals 312 and 322 have opposite phases. Consequently, those second potential difference harmonic components cancel each other out in the virtual MR element row. However, the third potential difference harmonic components denoted by reference numerals 313 and 323 cannot cancel each other out in the virtual MR element row. Accordingly, the waveform of the periodically varying component of the potential difference denoted by reference numeral 320 is distorted from the sinusoidal curve.

Figure 29:
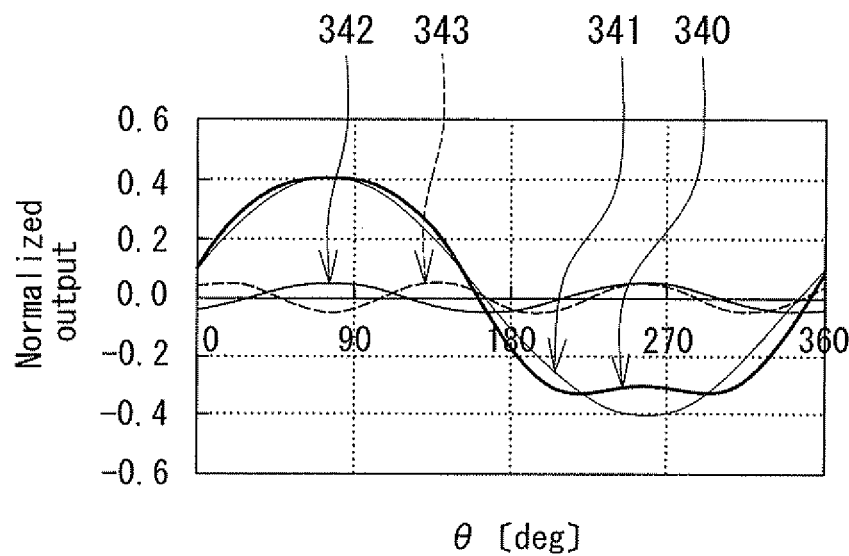
FIG. 29 is a waveform chart showing the waveform of a periodically varying component of the potential difference across one of two MR elements making up a first pair in the third embodiment of the invention.
Figure 30:
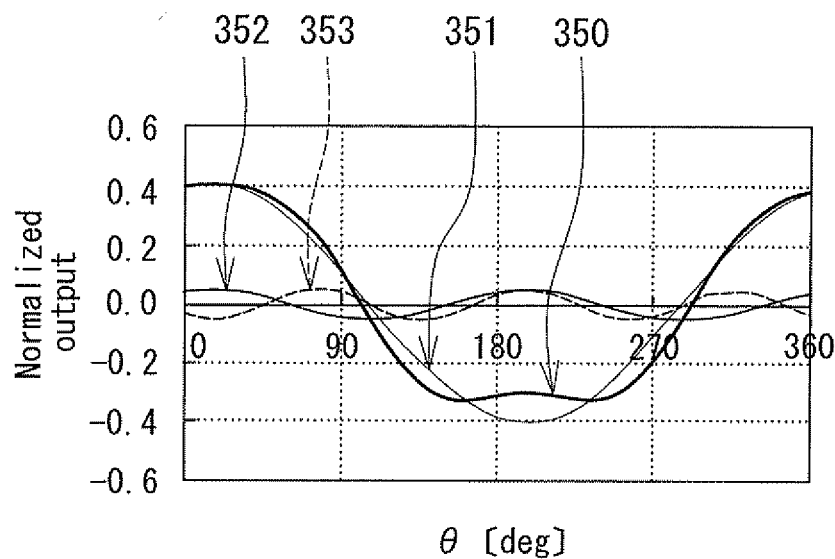
FIG. 30 is a waveform chart showing the waveform of a periodically varying component of the potential difference across the other of the two MR elements making up the first pair in the third embodiment of the invention.

FIG. 29 shows the waveform of the periodically varying component of the potential difference across the MR element R323. FIG. 30 shows the waveform of the periodically varying component of the potential difference across the MR element R324. FIG. 31 shows the waveform of the periodically varying component of the potential difference across the MR element R322. FIG. 32 shows the waveform of the periodically varying component of the potential difference across the MR element R321. The waveforms shown in FIG. 29 to FIG. 32 are obtained with the angles φ and ψ of FIG. 21 set to 45° and 30°, respectively. Reference numerals 340, 350, 360, and 370 in FIG. 29 to FIG. 32 indicate the waveforms of the periodically varying components of the respective potential differences. Reference numerals 341, 351, 361 and 371 each indicate an ideal sinusoidal curve. Reference numerals 342, 352, 362, and 372 indicate the waveforms of the second potential difference harmonic components that result from the second harmonic components included in the respective resistance harmonic components of the MR elements. Reference numerals 343, 353, 363, and 373 indicate the waveforms of the third potential difference harmonic components that result from the third harmonic components included in the respective resistance harmonic components of the MR elements.

The waveforms shown in FIG. 29 differ from the waveforms shown in FIG. 25 in phase by $\pi/12$ (15°), and differ from the waveforms shown in FIG. 26 in phase by $-\pi/6$ (−30°). The waveforms shown in FIG. 30 differ from the waveforms shown in FIG. 25 in phase by $5\pi/12$ (75°), and differ from the waveforms shown in FIG. 26 in phase by $\pi/6$ (30°). The waveforms shown in FIG. 31 differ from the waveforms shown in FIG. 25 in phase by $-\pi/12$ (−15°), and differ from the waveforms shown in FIG. 27 in phase by $\pi/6$ (30°). The waveforms shown in FIG. 32 differ from the waveforms shown in FIG. 25 in phase by $-5\pi/12$ (−75°), and differ from the waveforms shown in FIG. 27 in phase by $\pi/6$ (30°).

FIG. 33 shows the waveform (reference numeral 380) of the periodically varying component of the potential difference between the first end and the second end of the second MR element row R32. As with FIG. 29 to FIG. 32, the waveform shown in FIG. 33 is obtained with the angles φ and ψ of FIG. 21 set to 45° and 30°, respectively. FIG. 33 also shows the waveforms (reference numerals 340, 350, 360, and 370) of the periodically varying components of the respective potential differences shown in FIG. 29 to FIG. 32. As shown in FIG. 29 and FIG. 32, the phases of the second potential difference harmonic components denoted by reference numerals 342 and 372 are different from each other by 2φ (90°), and are thus opposite to each other. As shown in FIG. 30 and FIG. 31, the phases of the second potential difference harmonic components denoted by reference numerals 352 and 362 are different from each other by 2φ (90°), and are thus opposite to each other. As shown in FIG. 29 and FIG. 30, the phases of the third potential difference harmonic components denoted by reference numerals 343 and 353 are different from each other by 2ψ (60°), and are thus opposite to each other. As shown in FIG. 31 and FIG. 32, the phases of the third potential difference harmonic components denoted by reference numerals 363 and 373 are different from each other by 2ψ (60°), and are thus opposite to each other. Consequently, in the second MR element row R32, the second and third potential difference harmonic components in the four MR elements forming the MR element row are canceled out. As a result, the periodically varying component of the potential difference denoted by reference numeral 380 has a sinusoidal waveform with reduced distortion, i.e., with a reduced potential difference harmonic component, as compared with the waveform denoted by reference numeral 300 in FIG. 25 and the waveform denoted by reference numeral 330 in FIG. 28. According to the present embodiment, it is thus possible to reduce two different-order (second and third) potential difference harmonic components in the second MR element row R32. This holds true for the other MR element rows.

According to the present embodiment, setting φ to 45° and ψ to 30° allows reducing the second and third potential difference harmonic components in each MR element row. This makes it possible to reduce the error resulting from the second and third potential difference harmonic components in the angle detected by the rotating field sensor 5.

The above description has dealt with an example where the second and third potential difference harmonic components are reduced in each MR element row by setting φ and ψ to 45° and 30°, respectively. According to the present embodiment, however, it is also possible to reduce potential difference harmonic components of any two different orders in each MR element row by setting φ or ψ to ¼ the period of the potential difference harmonic component that is desired to reduce.

The other configuration, operation, and effects of the present embodiment are the same as those of the second embodiment.

The present invention is not limited to the foregoing embodiments, and various modifications may be made thereto. For example, each MR element row may include four or more pairs of MR elements so that potential difference harmonic components of three or more orders can be reduced in each MR element row. For example, each MR element in the third embodiment may be replaced with two MR elements having magnetization pinned layers whose magnetization directions are different by −22.5° and 22.5° from the magnetization direction of the magnetization pinned layer in a corresponding MR element in the third embodiment. This makes it possible to reduce the error resulting from the second, third, and fourth potential difference harmonic components in the angle detected by the rotating field sensor.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A rotating field sensor for detecting an angle that a direction of a rotating magnetic field in a reference position forms with respect to a reference direction, the rotating field sensor comprising:
   a first detection circuit that detects an intensity of a component of the rotating magnetic field in a first direction and outputs a first signal indicating the intensity;
   a second detection circuit that detects an intensity of a component of the rotating magnetic field in a second direction and outputs a second signal indicating the intensity; and
   an arithmetic circuit that calculates, based on the first and second signals, a detected angle value having a correspondence relationship with the angle that the direction of the rotating magnetic field in the reference position forms with respect to the reference direction, wherein:
   each of the first and second detection circuits includes at least one row of magnetoresistive elements;
   each of the at least one row of magnetoresistive elements is composed of a plurality of magnetoresistive elements connected in series;
   each of the plurality of magnetoresistive elements has a magnetization pinned layer whose magnetization direction is pinned, a free layer whose magnetization direction varies according to the direction of the rotating magnetic field, and a nonmagnetic layer disposed between the magnetization pinned layer and the free layer;
   the number of the plurality of magnetoresistive elements forming each row of magnetoresistive elements is an even number not smaller than two;
   the plurality of magnetoresistive elements forming each row of magnetoresistive elements include one or more pairs of magnetoresistive elements;
   the magnetization directions of the magnetization pinned layers in two magnetoresistive elements making up any of the one or more pairs form a predetermined relative angle other than 0° and 180°;
   the at least one row of magnetoresistive elements in the first detection circuit does not include any magnetoresistive element that has a magnetization pinned layer whose magnetization direction is pinned in the first direction or in a direction opposite to the first direction; and
   the at least one row of magnetoresistive elements in the second detection circuit does not include any magnetoresistive element that has a magnetization pinned layer whose magnetization direction is pinned in the second direction or in a direction opposite to the second direction.

2. The rotating field sensor according to claim 1, wherein the second direction is orthogonal to the first direction.

3. The rotating field sensor according to claim 1, wherein each of the first and second detection circuits includes, as the at least one row of magnetoresistive elements, two rows of magnetoresistive elements connected in series.

4. The rotating field sensor according to claim 1, wherein each of the first and second detection circuits includes, as the at least one row of magnetoresistive elements, first and second rows of magnetoresistive elements connected in series and third and fourth rows of magnetoresistive elements connected in series, the first to fourth rows of magnetoresistive elements forming a Wheatstone bridge circuit.

5. The rotating field sensor according to claim 4, wherein:
the magnetization pinned layer in each of the plurality of magnetoresistive elements that form the third row of magnetoresistive elements has the magnetization direction the same as that of the magnetization pinned layer in a corresponding one of the plurality of magnetoresistive elements that form the second row of magnetoresistive elements;
the magnetization pinned layer in each of the plurality of magnetoresistive elements that form the fourth row of magnetoresistive elements has the magnetization direction the same as that of the magnetization pinned layer in a corresponding one of the plurality of magnetoresistive elements that form the first row of magnetoresistive elements;
respective corresponding ones of the magnetoresistive elements in the first row and the fourth row whose magnetization pinned layers have the same magnetization direction are disposed adjacent to each other; and
respective corresponding ones of the magnetoresistive elements in the second row and the third row whose magnetization pinned layers have the same magnetization direction are disposed adjacent to each other.

6. The rotating field sensor according to claim 1, wherein:
the plurality of magnetoresistive elements that form the at least one row of magnetoresistive elements in the first detection circuit include only one pair of magnetoresistive elements, and the first direction is an intermediate direction between the magnetization directions of the magnetization pinned layers of two magnetoresistive elements making up the pair, or is a direction opposite to the intermediate direction; and
the plurality of magnetoresistive elements that form the at least one row of magnetoresistive elements in the second detection circuit include only one pair of magnetoresistive elements, and the second direction is an intermediate direction between the magnetization directions of the magnetization pinned layers of two magnetoresistive elements making up the pair, or is a direction opposite to the intermediate direction.

7. The rotating field sensor according to claim 1, wherein:
the plurality of magnetoresistive elements that form the at least one row of magnetoresistive elements in the first detection circuit include a first and a second pair of magnetoresistive elements;
the first direction is an intermediate direction between a third direction and a fourth direction or is a direction opposite to the intermediate direction, where the third direction is a direction intermediate between the magnetization directions of the magnetization pinned layers of two magnetoresistive elements making up the first pair, and the fourth direction is a direction intermediate between the magnetization directions of the magnetization pinned layers of two magnetoresistive elements making up the second pair;
the plurality of magnetoresistive elements that form the at least one row of magnetoresistive elements in the second detection circuit include a third and a fourth pair of magnetoresistive elements; and
the second direction is an intermediate direction between a fifth direction and a sixth direction or is a direction opposite to the intermediate direction, where the fifth direction is a direction intermediate between the magnetization directions of the magnetization pinned layers of two magnetoresistive elements making up the third pair, and the sixth direction is a direction intermediate between the magnetization directions of the magnetization pinned layers of two magnetoresistive elements making up the fourth pair.

8. A rotating field sensor for detecting an angle that a direction of a rotating magnetic field in a reference position forms with respect to a reference direction, the rotating field sensor comprising:
a first detection circuit that detects an intensity of a component of the rotating magnetic field in a first direction and outputs a first signal indicating the intensity;
a second detection circuit that detects an intensity of a component of the rotating magnetic field in a second direction and outputs a second signal indicating the intensity; and
an arithmetic circuit that calculates, based on the first and second signals, a detected angle value having a correspondence relationship with the angle that the direction of the rotating magnetic field in the reference position forms with respect to the reference direction, wherein:
each of the first and second detection circuits includes at least one row of magnetoresistive elements;
each of the at least one row of magnetoresistive elements is composed of a plurality of magnetoresistive elements connected in series along a potential gradient that occurs when the first or second detection circuit is in operation;
each of the plurality of magnetoresistive elements has a magnetization pinned layer whose magnetization direction is pinned, a free layer whose magnetization direction varies according to the direction of the rotating magnetic field, and a nonmagnetic layer disposed between the magnetization pinned layer and the free layer;
the number of the plurality of magnetoresistive elements forming each row of magnetoresistive elements is an even number not smaller than two;
the plurality of magnetoresistive elements forming each row of magnetoresistive elements include one or more pairs of magnetoresistive elements;
the magnetization directions of the magnetization pinned layers in two magnetoresistive elements making up any of the one or more pairs form a predetermined relative angle other than 0° and 180°;
the at least one row of magnetoresistive elements in the first detection circuit does not include any magnetoresistive element that has a magnetization pinned layer whose magnetization direction is pinned in the first direction or in a direction opposite to the first direction; and
the at least one row of magnetoresistive elements in the second detection circuit does not include any magnetoresistive element that has a magnetization pinned layer whose magnetization direction is pinned in the second direction or in a direction opposite to the second direction.

9. A rotating field sensor for detecting an angle that a direction of a rotating magnetic field in a reference position forms with respect to a reference direction, the rotating field sensor comprising:
a first detection circuit that detects an intensity of a component of the rotating magnetic field in a first direction and outputs a first signal indicating the intensity;
a second detection circuit that detects an intensity of a component of the rotating magnetic field in a second direction and outputs a second signal indicating the intensity; and
an arithmetic circuit that calculates, based on the first and second signals, a detected angle value having a correspondence relationship with the angle that the direction of the rotating magnetic field in the reference position forms with respect to the reference direction, wherein:

each of the first and second detection circuits includes at least one row of magnetoresistive elements, and a power supply port receiving a predetermined voltage;

each of the at least one row of magnetoresistive elements is composed of a plurality of magnetoresistive elements connected in series when viewed from the power supply port;

each of the plurality of magnetoresistive elements has a magnetization pinned layer whose magnetization direction is pinned, a free layer whose magnetization direction varies according to the direction of the rotating magnetic field, and a nonmagnetic layer disposed between the magnetization pinned layer and the free layer;

the number of the plurality of magnetoresistive elements forming each row of magnetoresistive elements is an even number not smaller than two;

the plurality of magnetoresistive elements forming each row of magnetoresistive elements include one or more pairs of magnetoresistive elements;

the magnetization directions of the magnetization pinned layers in two magnetoresistive elements making up any of the one or more pairs form a predetermined relative angle other than 0° and 180°;

the at least one row of magnetoresistive elements in the first detection circuit does not include any magnetoresistive element that has a magnetization pinned layer whose magnetization direction is pinned in the first direction or in a direction opposite to the first direction; and the at least one row of magnetoresistive elements in the second detection circuit does not include any magnetoresistive element that has a magnetization pinned layer whose magnetization direction is pinned in the second direction or in a direction opposite to the second direction.

* * * * *